United States Patent
Kijima et al.

(10) Patent No.: US 11,527,706 B2
(45) Date of Patent: Dec. 13, 2022

(54) FILM STRUCTURE BODY AND METHOD FOR MANUFACTURING THE SAME

(71) Applicant: Advanced Material Technologies, Inc., Chiba (JP)

(72) Inventors: Takeshi Kijima, Chiba (JP); Yasuaki Hamada, Chiba (JP); Yuuji Honda, Chiba (JP)

(73) Assignee: KRYSTAL INC., Yamaguchi (JP)

( * ) Notice: Subject to any disclaimer, the term of this patent is extended or adjusted under 35 U.S.C. 154(b) by 1196 days.

(21) Appl. No.: 16/027,574

(22) Filed: Jul. 5, 2018

(65) Prior Publication Data

US 2019/0013459 A1 Jan. 10, 2019

(30) Foreign Application Priority Data

Jul. 7, 2017 (TW) ................................ 106122906

(51) Int. Cl.
| | | |
|---|---|---|
| *H01L 41/187* | (2006.01) | |
| *H01L 41/047* | (2006.01) | |
| *H01L 41/297* | (2013.01) | |
| *H01L 41/314* | (2013.01) | |
| *H01L 41/083* | (2006.01) | |
| *H01L 41/316* | (2013.01) | |
| *H01L 41/318* | (2013.01) | |
| *H01L 41/08* | (2006.01) | |

(52) U.S. Cl.
CPC ...... *H01L 41/1876* (2013.01); *H01L 41/0471* (2013.01); *H01L 41/0477* (2013.01); *H01L 41/0478* (2013.01); *H01L 41/083* (2013.01); *H01L 41/0815* (2013.01); *H01L 41/297* (2013.01); *H01L 41/314* (2013.01); *H01L 41/316* (2013.01); *H01L 41/318* (2013.01)

(58) Field of Classification Search
CPC ....................... H01L 41/1876; H01L 41/0471; H01L 41/083
See application file for complete search history.

(56) References Cited

U.S. PATENT DOCUMENTS

2015/0194592 A1* 7/2015 Aida ....................... H01L 41/18
310/311
2015/0364670 A1* 12/2015 Ohta .................... H01L 41/0805
310/363
(Continued)

FOREIGN PATENT DOCUMENTS

| JP | 2014-84494 | 5/2014 |
| WO | 2016/009698 | 1/2016 |

OTHER PUBLICATIONS

Shinya Yoshida et al., "Fabrication and characterization of large figure-of-merit epitaxial PMnN-PZT/Si transducer for piezoelectric MEMS sensors", Sensors and Actuators A 239, 2016, pp. 201-208.
(Continued)

*Primary Examiner* — Bryan P Gordon
(74) *Attorney, Agent, or Firm* — Wenderoth, Lind & Ponack, L.L.P.

(57) ABSTRACT

A film structure body has: a substrate that is a silicon substrate including an upper surface composed of a (100) plane; an orientation film including a zirconium oxide film that is cubic crystal (100)-oriented on the upper surface; and a conductive film including a platinum film that is cubic crystal (100)-oriented on the orientation film.

11 Claims, 24 Drawing Sheets

(56) References Cited

U.S. PATENT DOCUMENTS

2017/0092840 A1* 3/2017 Itayama ................. B41J 2/1642
2017/0158571 A1* 6/2017 Kijima .................... C04B 41/87
2017/0179367 A1* 6/2017 Kijima ................ H01L 41/0477

OTHER PUBLICATIONS

Masafumi Kobune et al., "Growth and Characterization of Lead Titanate Single Crystals Grown in a Magnesia Single Crystal Crucible", Journal of the Ceramic Association, vol. 95, No. 11, 1987, pp. 1053-1058 (with English abstract).

* cited by examiner

FIG. 27

| | HIGH-FREQUENCY POWER (W) | FILM DEPOSITION RATE (nm/s) | $2\theta_{004}$ (°) | RESIDUAL POLARIZATION $P_r$ (μC/cm²) | RELATIVE PERMITTIVITY $\varepsilon_r$ (-) | $P_r \cdot \varepsilon_r$ (μC/cm²) | PIEZOELECTRIC CONSTANT $d_{31}$ (pm/V) | CRACK |
|---|---|---|---|---|---|---|---|---|
| COMPARATIVE EXAMPLE 1 | 2750 | 0.65 | 97.0 | 10 | 800 | 8000 | 140 | × |
| COMPARATIVE EXAMPLE 2 | 2500 | 0.42 | 96.8 | 18 | 580 | 10440 | 178 | × |
| EXAMPLE 1 | 2250 | 0.29 | 96.5 | 28 | 450 | 15750 | 200 | ○ |
| EXAMPLE 6 | 2000 | 0.22 | 96.4 | 39 | 330 | 13200 | 210 | ○ |
| EXAMPLE 7 | 1750 | 0.16 | 96.1 | 48 | 263 | 12624 | 220 | ○ |
| EXAMPLE 8 | 1500 | 0.11 | 95.9 | 57 | 216 | 12312 | 230 | ○ |

FILM STRUCTURE BODY AND METHOD FOR MANUFACTURING THE SAME

BACKGROUND OF THE INVENTION

Field of the Invention

The present invention relates to a film structure body and a method for manufacturing the same.

Background Art

As a film structure body having a substrate, a conductive film formed on the substrate, and a piezoelectric film formed on the conductive film, there is known a film structure body having a substrate, a conductive film that is formed on the substrate and that contains platinum, and a piezoelectric film that is formed on the conductive film and that contains lead zirconate titanate (PZT).

International Publication No. 2016/009698 (Patent Literature 1) discloses a technology in which a $Pb(Zr_{1-A}Ti_A)O_3$ film and a $Pb(Zr_{1-x}Ti_x)O_3$ film formed on the $Pb(Zr_{1-A}Ti_A)O_3$ film are provided, and A and x satisfy $0 \leq A \leq 0.1$ and $0.1 < x < 1$ in ferroelectric ceramics.

Japanese Patent Publication No. 2014-84494 (Patent Literature 2) discloses a technology in which a PZT thin film is formed on a buffer layer previously formed by sequentially stacking films of YSZ (8% $Y_2O_3$+92% $ZrO_2$), $CeO_2$ and $LaSrCoO_3$ on a silicon substrate (Si). In addition, Patent Literature 2 discloses a technology in which $LaSrCoO_3$ (LSCO) is lattice-rotated by 45° relative to other films.

Non-Patent Literature 1 discloses a technology in which a buffer layer, which is formed by sequentially stacking YSZ, $CeO_2$, $La_{0.5}Sr_{0.5}CoO_3$ (LSCO) and $SrRuO_3$ (SRO), is formed on a silicon substrate, and a c-axis-oriented $0.06Pb(Mn_{1,3}, Nb_{2/3})O_3\text{-}0.94Pb(Zr_{0.5}Ti_{0.5})O_3$ (PMnN-PZT) epitaxial thin film is formed on the buffer layer. Non-Patent Literature 1 discloses a technology in which the crystal lattice of PMnN-PZT is rotated by 45° relative to Si in an in-plane direction.

Non-Patent Literature 2 discloses a technology in which relative permittivity of $PbTiO_3$ grown by a flux method through the use of a MgO single crystal crucible is 150 at room temperature, and is 1.5 times the relative permittivity of a pure $PbTiO_3$ single crystal.

Description of Related Art

Patent Document

Patent Literature 1: International Publication No. 2016/009698
Patent Literature 2: Japanese Patent Publication No. 2014-84494

Non-Patent Document

Non-Patent Literature 1: S. Yoshida et al., "Fabrication and characterization of large figure-of-merit epitaxial PMnN-PZT/Si transducer for piezoelectric MEMS sensors," Sensors and Actuators A 239 (2016) 201-208
Non-Patent Literature 2: M. Kobune et al., "Growth of $PbTiO_3$ single crystal by MgO single crystal crucible and evaluation," Journal of the Ceramic Association, Japan, vol. 95, No. 11 (1987) p. 1053-1058

SUMMARY OF THE INVENTION

Problems to be Solved

In a piezoelectric film containing lead zirconate titanate, in a case where a quality such as crystallinity of the piezoelectric film is not good, a piezoelectric property of the piezoelectric film deteriorates. On the other hand, in a case where a quality such as crystallinity of a piezoelectric film is good, a piezoelectric property of the piezoelectric film is enhanced. However, when relative permittivity of the piezoelectric film has not been made small, for example, in a case where the piezoelectric film is to be used as a pressure sensor, detection sensitivity of the pressure sensor may drop for the reason of, for example, increase in capacitance of the pressure sensor etc. and design of a detection circuit of the pressure sensor may become difficult.

The present invention has been made in order to solve problems in conventional technologies as described above, and aims at providing a film structure body, in a film structure body having a piezoelectric film containing lead zirconate titanate, which can enhance a piezoelectric property of a piezoelectric film and can enhance detection sensitivity of a pressure sensor using the piezoelectric film.

Means to Solve the Problem

Simple outline explanations of typical inventions, among those disclosed in the present application, are as follows.

A film structure body as an aspect of the present invention has a silicon substrate including a principal surface composed of a (100) plane and a first film that is formed on the principal surface, and that includes a zirconium oxide film having a cubic crystal structure and being (100)-oriented. In addition, the film structure body has a first conductive film that is formed on the first film, and that includes a platinum film having a cubic crystal structure and being (100)-oriented.

Furthermore, as another aspect, the film structure body may have a first piezoelectric film that is formed on the first conductive film, and that includes a first lead zirconate titanate film having a tetragonal crystal structure and being (001)-oriented.

Moreover, as another aspect, in an X-ray diffraction pattern of the first piezoelectric film by a θ-2θ method using a CuKα ray, when a diffraction angle of a diffraction peak of a (004) plane of lead zirconate titanate is denoted as $2\theta_{004}$; and relative permittivity of the first piezoelectric film is denoted as $\varepsilon_r$, $2\theta_{004}$ may satisfy a following formula (Mathematical Formula 1), and $\varepsilon_r$ may satisfy a following formula (Mathematical Formula 2).

$$2\theta_{004} \leq 96.5° \quad \text{(Mathematical Formula 1)}$$

$$\varepsilon_r \leq 450 \quad \text{(Mathematical Formula 2)}$$

In addition, as another aspect, when a residual polarization value of the first piezoelectric film is denoted as $P_r$, $P_r$ may satisfy a following formula (Mathematical Formula 3).

$$P_r \geq 28\mu C/cm^2 \quad \text{(Mathematical Formula 3)}$$

Furthermore, as another aspect, the film structure body may have a second conductive film formed on the first piezoelectric film, and relative permittivity may be measured by applying an alternating voltage having a frequency of 1 kHz between the first conductive film and the second conductive film.

Moreover, as another aspect, the first piezoelectric film may include a second piezoelectric film that is formed on the first conductive film and that includes a second lead zirconate titanate film having a tetragonal crystal structure and being (001)-oriented, and a third piezoelectric film that is formed on the second piezoelectric film and that includes a third lead zirconate titanate film. The second piezoelectric film may have compression stress, and the third piezoelectric film may have tensile stress.

In addition, as another aspect, the second lead zirconate titanate film may have a first composite oxide composed of lead zirconate titanate represented by a following general formula (Chemical Formula 1), and the third lead zirconate titanate film may have a second composite oxide composed of lead zirconate titanate represented by a following general formula (Chemical Formula 2).

$$Pb(Zr_{1-x}Ti_x)O_3 \quad \text{(Chemical Formula 1)}$$

$$Pb(Zr_{1-y}Ti_y)O_3 \quad \text{(Chemical Formula 2)}$$

x may satisfy 0.32≤x≤0.52, and y may satisfy 0.32≤y≤0.52.

Moreover, as another aspect, the film structure body may have a second film that is formed on the first conductive film and that contains a third composite oxide represented by a following general formula (Chemical Formula 3) and (100)-oriented in the pseudo-cubic representation.

$$Sr(Ti_{1-z}Ru_z)O_3 \quad \text{(Chemical Formula 3)}$$

The first piezoelectric film may be formed over the first conductive film via the second film, and z may satisfy 0≤z≤1.

A film structure body as an aspect of the present invention has a silicon substrate including a principal surface composed of a (100) plane, and a first film that is formed on the principal surface and that contains zirconium oxide having a cubic crystal structure and being (100)-oriented. Furthermore, the film structure body has a first conductive film that is formed on the first film and that contains platinum having a cubic crystal structure and being (100)-oriented, and a first piezoelectric film that is formed on the first conductive film and that contains lead zirconate titanate having a tetragonal crystal structure and being (001)-oriented. In an X-ray diffraction pattern of the first piezoelectric film by the θ-2θ method using a CuKα ray, when a diffraction angle of diffraction peak of the (004) plane of lead zirconate titanate is denoted as $2\theta_{004}$, and relative permittivity of the first piezoelectric film is denoted as $\varepsilon_r$, $2\theta_{004}$ may satisfy the following formula (Mathematical Formula 1), and $\varepsilon_r$ may satisfy the following formula (Mathematical Formula 2).

$$2\theta_{004} \leq 96.5° \quad \text{(Mathematical Formula 1)}$$

$$\varepsilon_r \leq 450 \quad \text{(Mathematical Formula 2)}$$

In addition, as another aspect, when a residual polarization value of the first piezoelectric film is denoted as $P_r$, $P_r$ may satisfy the following formula (Mathematical Formula 3).

$$P_r \geq 28 \mu C/cm^2 \quad \text{(Mathematical Formula 3)}$$

Furthermore, as another aspect, the film structure body may have a second conductive film formed on the first piezoelectric film, and relative permittivity may be measured by applying an alternating voltage having a frequency of 1 kHz between the first conductive film and the second conductive film.

Moreover, as another aspect, the first piezoelectric film may include a second piezoelectric film that is formed on the first conductive film and that contains a first composite oxide composed of lead zirconate titanate, and a third piezoelectric film that is formed on the second piezoelectric film and that contains a second composite oxide composed of lead zirconate titanate. The second piezoelectric film may have compression stress, and the third piezoelectric film may have tensile stress.

In addition, as another aspect, the second piezoelectric film may have a first composite oxide represented by the following general formula (Chemical Formula 1), and the third piezoelectric film may have a second composite oxide represented by the following general formula (Chemical Formula 2).

$$Pb(Zr_{1-x}Ti_x)O_3 \quad \text{(Chemical Formula 1)}$$

$$Pb(Zr_{1-y}Ti_y)O_3 \quad \text{(Chemical Formula 2)}$$

x may satisfy 0.32≤x≤0.52, and y may satisfy 0.32≤y≤0.52.

Furthermore, as another aspect, the film structure body may have a second film that is formed on the first conductive film and that contains a third composite oxide represented by the following general formula (Chemical Formula 3) and (100)-oriented in the pseudo-cubic representation.

$$Sr(Ti_{1-z}Ru_z)O_3 \quad \text{(Chemical Formula 3)}$$

The first piezoelectric film may be formed over the first conductive film via the second film, and z may satisfy 0≤z≤1.

Moreover, as another aspect, the first film may be epitaxially grown on the principal surface, the first conductive film may be epitaxially grown on the first film, and the first piezoelectric film may be epitaxially grown on the first conductive film.

A method for manufacturing a film structure body as an aspect of the present invention has the steps of: (a) preparing a silicon substrate including a principal surface composed of a (100) plane; (b) forming a first film including a zirconium oxide film having a cubic crystal structure and being (100)-oriented, on the principal surface. In addition, the method for manufacturing a film structure body has the step of: (c) forming a first conductive film including a platinum film having a cubic crystal structure and being (100)-oriented, on the first film.

Furthermore, as another aspect, the method for manufacturing a film structure body may have the step of: (d) forming a first piezoelectric film including a first lead zirconate titanate film having a tetragonal crystal structure and being (001)-oriented, on the first conductive film.

Moreover, as another aspect, in an X-ray diffraction pattern of the first piezoelectric film by the θ-2θ method using a CuKα ray, when a diffraction angle of diffraction peak of the (004) plane of lead zirconate titanate is denoted as $2\theta_{004}$, and relative permittivity of the first piezoelectric film is denoted as $\varepsilon_r$, $2\theta_{004}$ may satisfy the following formula (Mathematical Formula 1), and $\varepsilon_r$ may satisfy the following formula (Mathematical Formula 2).

$$2\theta_{004} \leq 96.5° \quad \text{(Mathematical Formula 1)}$$

$$\varepsilon_r \leq 450 \quad \text{(Mathematical Formula 2)}$$

In addition, as another aspect, when a residual polarization value of the first piezoelectric film is denoted as $P_r$, $P_r$ may satisfy the following formula (Mathematical Formula 3).

$$P_r \geq 28 \mu C/cm^2 \quad \text{(Mathematical Formula 3)}$$

Furthermore, as another aspect, the method for manufacturing a film structure body may have the step of: (e)

forming a second conductive film on the first piezoelectric film, wherein the relative permittivity may be measured by applying an alternating voltage having a frequency of 1 kHz between the first conductive film and the second conductive film.

Moreover, as another aspect, the step (d) may include the steps of: (f) forming a second piezoelectric film including a second lead zirconate titanate film having a tetragonal crystal structure and being (001)-oriented, on the first conductive film; and (g) forming a third piezoelectric film including a third lead zirconate titanate film, on the second piezoelectric film. The step (f) may form a second piezoelectric film having compression stress, and the step (g) may form a third piezoelectric film having tensile stress.

In addition, as another aspect, the second lead zirconate titanate film may have a first composite oxide composed of lead zirconate titanate represented by the following general formula (Chemical Formula 1), and the third lead zirconate titanate film may have a second composite oxide composed of lead zirconate titanate represented by the following general formula (Chemical Formula 2).

$$Pb(Zr_{1-x}Ti_x)O_3 \quad \text{(Chemical Formula 1)}$$

$$Pb(Zr_{1-y}Ti_y)O_3 \quad \text{(Chemical Formula 2)}$$

x may satisfy $0.32 \leq x \leq 0.52$, and y may satisfy $0.32 \leq y \leq 0.52$.

Furthermore, as another aspect, the step (f) may form a second piezoelectric film by a sputtering method. The step (g) may include the steps of: (g1) forming a second film containing a first precursor of the second composite oxide by applying a first solution containing lead, zirconium and titanium onto the second piezoelectric film, and (g2) forming the third piezoelectric film by heat-treating the second film.

Moreover, as another aspect, the step (f) may deposit a third film containing the first composite oxide at a temperature of 425 to 475° C. and at a first deposition rate of not more than 0.29 nm/s, and may form the second piezoelectric film composed of the third film having been deposited.

In addition, as another aspect, the step (f) may include the steps of: (f1) depositing a fourth film containing the first composite oxide at a temperature of 425 to 475° C. and at a second deposition rate of not more than 0.29 nm/s, and (f2) depositing a fifth film containing the first composite oxide at a temperature of 425 to 475° C. and at a third deposition rate smaller than the second deposition rate on the fourth film and forming a second piezoelectric film composed of the fourth film and the fifth film having been deposited.

Furthermore, as another aspect, the step (f) may include the steps of: (f3), after the step (c), holding a silicon substrate with a substrate-holding part inside a chamber; and (f4), after the step (f3), depositing the second piezoelectric film on the first conductive film by sputtering a surface of a target containing lead zirconate titanate inside the chamber. The substrate-holding part is supported with a support part attached to the chamber, a first insulating member is interposed between the support part and the substrate-holding part, or between the chamber and the support part, and the step (f3) may hold the silicon substrate in a state where an outer peripheral part of the silicon substrate comes into contact with the substrate-holding part, and a central part of the silicon substrate is separated from the substrate-holding part.

Moreover, as another aspect, the step (f) may include the steps of: (f5), after the step (c), holding a silicon substrate with the substrate-holding part inside the chamber; and (f6), after the step (f5), causing a deposition material to adhere onto the first conductive film by sputtering a surface of the target containing lead zirconate titanate inside the chamber to thereby deposit the second piezoelectric film. The step (f6) prevents the deposition material from adhering to the substrate-holding part with a deposition-preventive plate that is attached to the chamber and that is composed of a first conductive member, a second insulating member may be interposed between the chamber and the deposition-preventive plate, and the deposition-preventive plate may electrically float. The step (f5) may hold the silicon substrate in a state where the outer peripheral part of the silicon substrate comes into contact with the substrate-holding part, and the central part of the silicon substrate is separated from the substrate-holding part.

Moreover, as another aspect, the method for manufacturing a film structure body may have the step of (h), after the step (c) and before the step (d), forming a sixth film containing a third composite oxide that is represented by the following general formula (Chemical Formula 3) and that is (100)-oriented in the pseudo-cubic representation, on the first conductive film.

$$Sr(Ti_{1-z}Ru_z)O_3 \quad \text{(Chemical Formula 3)}$$

z may satisfy $0 \leq z \leq 1$.

A method for manufacturing a film structure body as an aspect of the present invention has the steps of: (a) preparing a silicon substrate including a principal surface composed of a (100) plane; and (b) forming a first film containing zirconium oxide having a cubic crystal structure and being (100)-oriented, on the principal surface. In addition, the method for manufacturing a film structure body has the steps of: (c) forming a first conductive film containing platinum having a cubic crystal structure and being (100)-oriented, on the first film; and (d) forming a first piezoelectric film containing lead zirconate titanate having a tetragonal crystal structure and being (001)-oriented, on the first conductive film. In an X-ray diffraction pattern of the first piezoelectric film by a θ-2θ method using a CuKα ray, when a diffraction angle of diffraction peak of the (004) plane of lead zirconate titanate is denoted as $2\theta_{004}$, and relative permittivity of the first piezoelectric film is denoted as $\varepsilon_r$, $2\theta_{004}$ satisfies the following formula (Mathematical Formula 1), and $\varepsilon_r$ satisfies the following formula (Mathematical Formula 2).

$$2\theta_{004} \leq 96.5° \quad \text{(Mathematical Formula 1)}$$

$$\varepsilon_r \leq 450 \quad \text{(Mathematical Formula 2)}$$

Furthermore, as another aspect, when a residual polarization value of the first piezoelectric film is denoted as $P_r$, $P_r$ may satisfy the following formula (Mathematical Formula 3).

$$P_r \geq 28 \mu C/cm^2 \quad \text{(Mathematical Formula 3)}$$

Moreover, as another aspect, the method for manufacturing a film structure body may have the step of: (e) forming a second conductive film on the first piezoelectric film, wherein the relative permittivity may be measured by applying an alternating voltage having a frequency of 1 kHz between the first conductive film and the second conductive film.

In addition, as another aspect, the step (d) may include the steps of: (f) forming a second piezoelectric film containing a first composite oxide composed of lead zirconate titanate, on the first conductive film; and (g) forming a third piezoelectric film containing a second composite oxide composed of lead zirconate titanate, on the second piezoelectric film. The step (f) may form a second piezoelectric film having compression stress, and the step (g) may form a third piezoelectric film having tensile stress.

Furthermore, as another aspect, the step (f) may form the second piezoelectric film containing a first composite oxide represented by the following general formula (Chemical Formula 1); and the step (g) may form the third piezoelectric film containing a second composite oxide represented by the following general formula (Chemical Formula 2).

$$Pb(Zr_{1-x}Ti_x)O_3 \qquad \text{(Chemical Formula 1)}$$

$$Pb(Zr_{1-y}Ti_y)O_3 \qquad \text{(Chemical Formula 2)}$$

x may satisfy 0.32≤x≤0.52, and y may satisfy 0.32≤y≤0.52.

Moreover, as another aspect, the step (f) may form the second piezoelectric film by a sputtering method. The step (g) may include the steps of: (g1) forming a second film containing a first precursor of the second composite oxide by applying a first solution containing lead, zirconium and titanium onto the second piezoelectric film; and (g2) forming a third piezoelectric film by heat-treating the second film.

In addition, as another aspect, the step (f) may deposit a third film containing the first composite oxide at a temperature of 425 to 475° C. and at a first deposition rate of not more than 0.29 nm/s, and may form the second piezoelectric film composed of the third film having been deposited.

Furthermore, as another aspect, the step (f) may include the steps of: (f1) depositing a fourth film containing the first composite oxide at a temperature of 425 to 475° C. and at a second deposition rate of not more than 0.29 nm/s; and (f2) depositing a fifth film containing the first composite oxide at a temperature of 425 to 475° C. and at a third deposition rate smaller than the second deposition rate on the fourth film and forming a second piezoelectric film composed of the fourth film and the fifth film having been deposited.

Moreover, as another aspect, the method for manufacturing a film structure body may include, after the step (c) and before the step (d), the step of: (h) forming a sixth film containing a third composite oxide that is represented by the following general formula (Chemical Formula 3) and that is (100)-oriented in the pseudo-cubic representation, on the first conductive film.

$$Sr(Ti_{1-z}Ru_z)O_3 \qquad \text{(Chemical Formula 3)}$$

z may satisfy 0≤z≤1.

Moreover, as another aspect, the step (b) may form a first film epitaxially grown on the principal surface, the step (c) may form a first conductive film epitaxially grown on the first film, and the step (d) may form a first piezoelectric film epitaxially grown on the first conductive film.

As a consequence of applying one aspect of the present invention, in a film structure body having a piezoelectric film containing lead zirconate titanate, it is possible to enhance a piezoelectric property of the piezoelectric film, and to enhance detection sensitivity of a pressure sensor using the piezoelectric film.

BRIEF DESCRIPTION OF THE DRAWINGS

FIG. 27 illustrates a table that lists film deposition conditions, and measurement results of a diffraction angle $2\theta_{004}$, relative permittivity $\varepsilon_r$ etc. of PZT with respect to each of Example 1, Examples 6 to 8, Comparative Examples 1 and 2.

DESCRIPTION OF THE PREFERRED EMBODIMENTS

Figure 1:
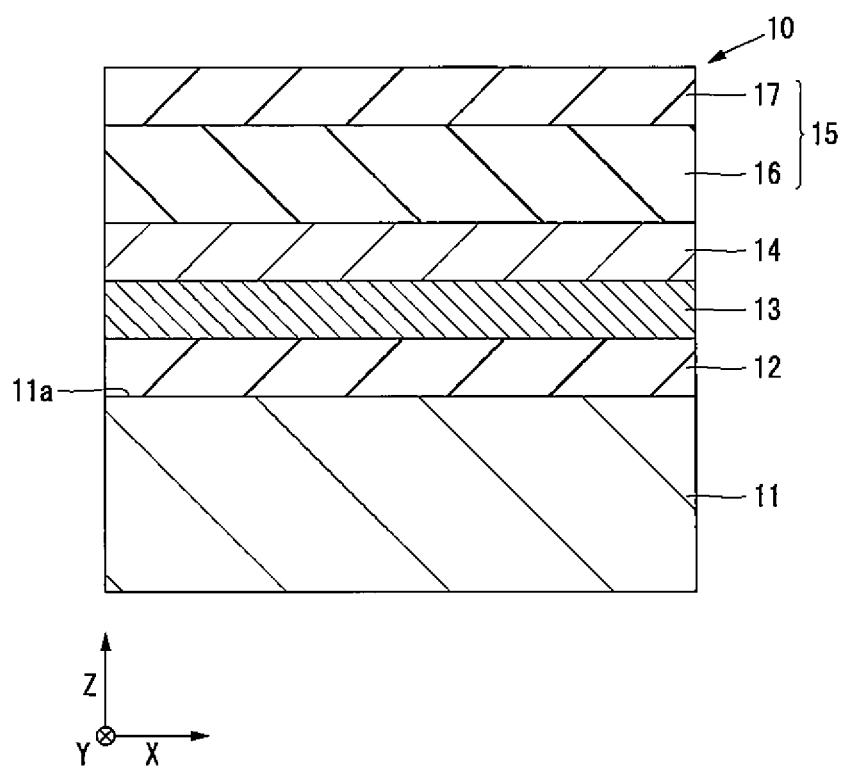
FIG. 1 is a cross-sectional view of a film structure body of an embodiment.

Hereinafter, embodiments of the present invention will be described in detail through the use of the drawings. However, a person skilled in the art would easily understand that the present invention is not limited to the following explanation, but that forms and details thereof can be variously modified without deviating from the purport and the scope of the present invention. Accordingly, the present invention is not to be construed as being limited to description of the embodiments shown below.

Moreover, for the purpose of making the description more clear and accurate, drawings may be represented schematically about width, thickness, shape etc. of each part as compared with embodiments, but they are only examples and do not limit the interpretation of the present invention.

Moreover, in the present description and each drawing, an element similar to aforementioned one with respect to an already-mentioned drawing, the same symbol is given and detailed description may be omitted.

Further, in drawings for use in embodiments, hatching (shading) given for differentiating structures may be omitted in accordance with the drawing.

Note that, in embodiments below, in a case where a range is represented as A-B, it represents a range of not less than A to not more than B, unless otherwise clearly noted.

Embodiments

<Film Structure Body>

Figure 2:
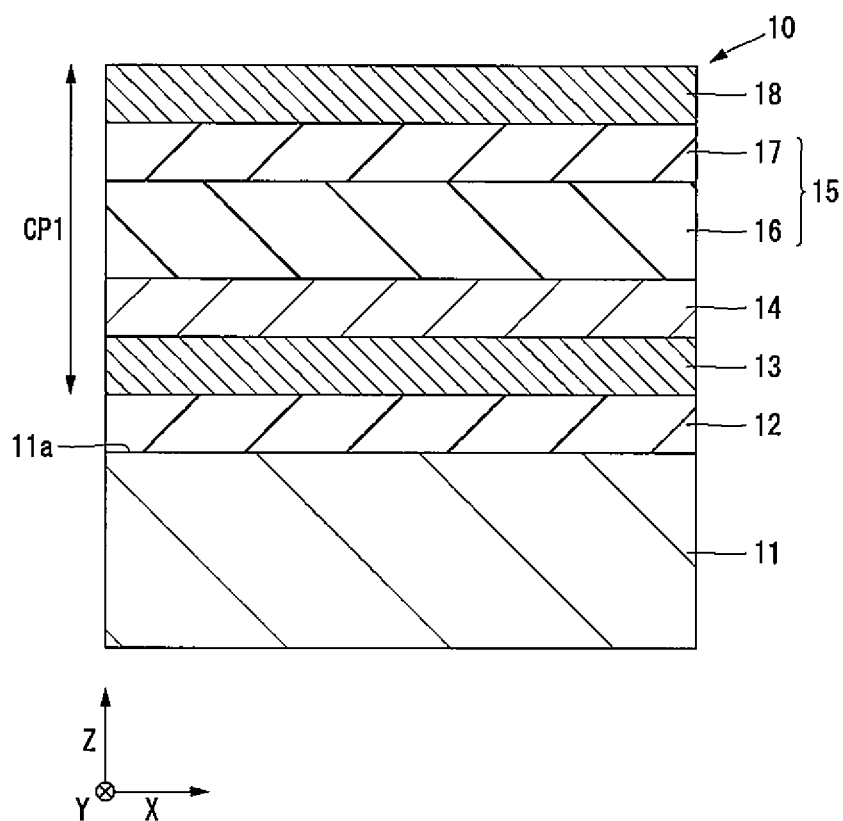
FIG. 2 is a cross-sectional view of a film structure body in a case where the film structure body of the embodiment has a conductive film as an upper electrode.
Figure 3:
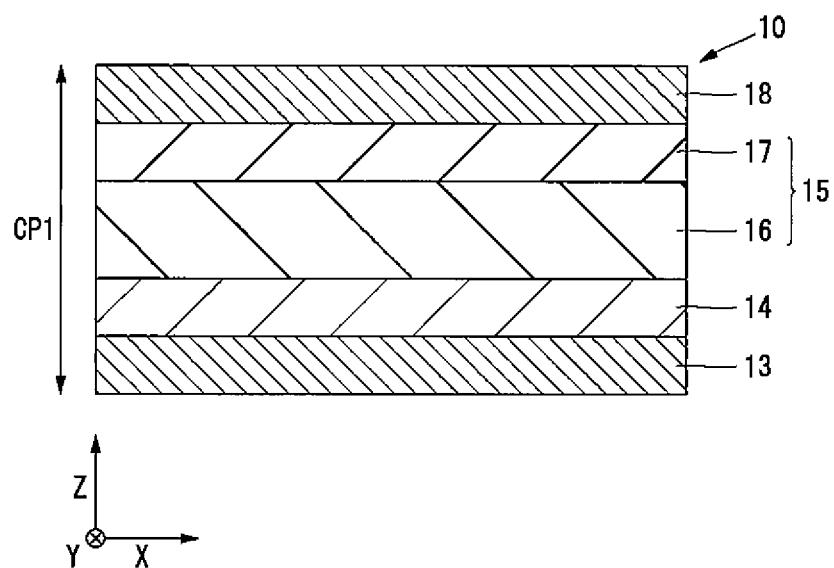
FIG. 3 is a cross-sectional view of a film structure body in a case where a substrate and an orientation film are removed from the film structure body shown in FIG. 2.
Figure 4:
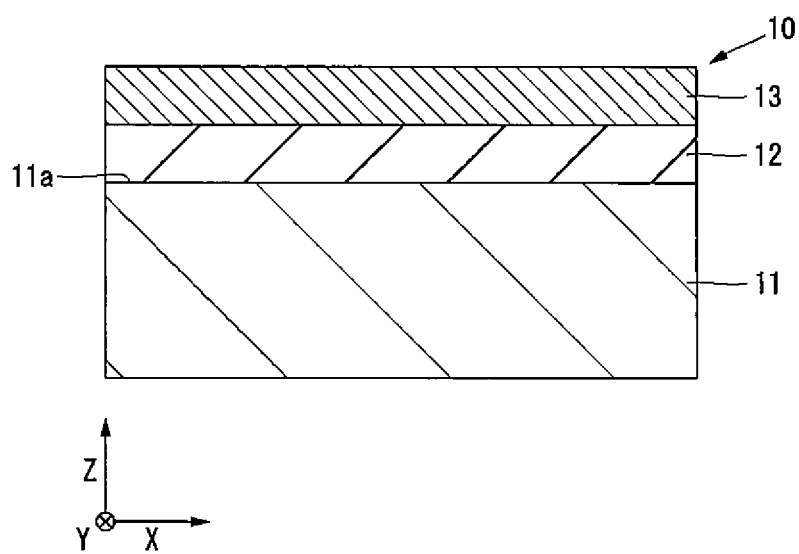
FIG. 4 is a cross-sectional view of another example of a film structure body of the embodiment.

First, the film structure body of the embodiment that is an aspect of the present invention will be described. FIG. 1 is a cross-sectional view of a film structure body of an embodiment. FIG. 2 is a cross-sectional view of a film structure body in a case where the film structure body of the embodiment has a conductive film as an upper electrode. FIG. 3 is a cross-sectional view of a film structure body in a case where a substrate and an orientation film are removed from the film structure body shown in FIG. 2. FIG. 4 is a cross-sectional view of another example of the film structure body of the embodiment.

As shown in FIG. 1, a film structure body 10 of this embodiment has a substrate 11, an orientation film 12, a conductive film 13, a film 14, and a piezoelectric film 15. The orientation film 12 is formed on the substrate 11. The conductive film 13 is formed on the orientation film 12. The film 14 is formed on the conductive film 13. The piezoelectric film 15 is formed on the film 14.

Note that, as shown in FIG. 2, the film structure body 10 of this embodiment may have a conductive film 18. The conductive film 18 is formed on the piezoelectric film 15. At this time, the conductive film 13 is a conductive film as a lower electrode, and the conductive film 18 is a conductive film as an upper electrode. Furthermore, as shown in FIG. 3, the film structure body 10 of this embodiment may be one that does not have the substrate 11 (refer to FIG. 2) and the orientation film 12 (refer to FIG. 2), and that has only the conductive film 13 as a lower electrode, the film 14, the piezoelectric film 15, and the conductive film 18 as an upper electrode.

Moreover, as shown in FIG. 4, the film structure body 10 of this embodiment may be one that has only the substrate 11, the orientation film 12, and the conductive film 13. In such a case, the film structure body 10 can be used as an electrode substrate for forming the piezoelectric film 15, and the piezoelectric film 15 that is epitaxially grown and has a good piezoelectric property can easily be formed on the conductive film 13.

The substrate 11 is a silicon substrate made of a silicon (Si) single crystal. The substrate 11 as a silicon substrate contains an upper surface 11a as a principal surface composed of a (100) plane. The orientation film 12 is formed on the upper surface 11a, has a cubic crystal structure, and contains (100)-oriented zirconium oxide. The conductive film 13 has a cubic crystal structure, and contains (100)-oriented platinum. Accordingly, in a case where the piezoelectric film 15 contains a composite oxide having a perovskite-like structure, the piezoelectric film 15 can be (001)-oriented in the tetragonal representation, or (100)-oriented in the pseudo-cubic representation, on the substrate 11.

Herein, "the orientation film 12 is (100)-oriented" means that the (100) plane of the orientation film 12 having a cubic crystal structure is along the upper surface 11a as the principal surface composed of the (100) plane of the substrate 11 being a silicon substrate, and means that, preferably, the (100) plane of the orientation film 12 is parallel to the upper surface 11a composed of the (100) plane of the substrate 11 being a silicon substrate. In addition, "the (100) plane of the orientation film 12 is parallel to the upper surface 11a composed of the (100) plane of the substrate 11" means not only a case where the (100) plane of the orientation film 12 is completely parallel to the upper surface 11a of the substrate 11, but also a case where an angle formed between a plane completely parallel to the upper surface 11a of the substrate 11 and the (100) plane of the orientation film 12 is not more than 20°. In addition, the same also applies not only to the orientation of the orientation film 12, but also to orientation of a film of another layer.

Alternatively, an orientation film 12 composed of stacked films may be formed on the substrate 11, in place of the orientation film 12 composed of a single layer film, as the orientation film 12.

Preferably, the orientation film 12 is epitaxially grown on the upper surface 11a of the substrate 11, and the conductive film 13 is epitaxially grown on the orientation film 12. Accordingly, in a case where the piezoelectric film 15 contains a composite oxide having a perovskite-like structure, the piezoelectric film 15 can be epitaxially grown on the conductive film 13.

The film 14 contains a composite oxide that is represented by the following general formula (Chemical Formula 4) and that is (100)-oriented in the pseudo-cubic representation.

$$Sr(Ti_{1-z}Ru_z)O_3 \qquad \text{(Chemical Formula 4)}$$

Here, z satisfies $0 \leq z \leq 1$. Note that, hereinafter, $Sr(Ti_{1-z}Ru_z)O_3$ when z satisfies z=0, that is, $SrTiO_3$ may be referred to as STO, $Sr(Ti_{1-z}Ru_z)O_3$ when z satisfies $0<z<1$ may be referred to as STRO, and $Sr(Ti_{1-z}Ru_z)O_3$ when z satisfies z=1, that is, $SrRuO_3$ may be referred to as SRO.

SRO has a metal conductive property, and STO has a semi-conductive property or an insulating property. Accordingly, as z comes closer to 1, the conductive property of the film 14 is enhanced, and thus the film 14 can be used as apart of a lower electrode including the conductive film 13.

Herein, in a case where the film 14 is formed by a sputtering method, z satisfies preferably 0≤z≤0.4, more preferably 0.05≤z≤0.2. In a case where z exceeds 0.4, the composite oxide represented by the general formula (Chemical Formula 4) may become powdery and may not be sufficiently solidified to thereby make it difficult to manufacture a sputtering target.

On the other hand, in a case where the film 14 is formed by a coating method such as a sol-gel method, the film 14 can be easily formed even when z>0.4.

"A composite oxide that is represented by the general formula (Chemical Formula 4) and has a perovskite-like structure is (100)-oriented in the pseudo-cubic representation" means a case as described below.

First, there is assumed a case where, in a crystal lattice of perovskite-like structure that includes a three-dimensionally disposed unit lattice and that is represented by a general formula $ABO_3$, the unit lattice has one atom A, one atom B and three oxygen atoms.

In such a case, "(100)-oriented in the pseudo-cubic representation" means a case where the unit lattice has a cubic crystal structure and is (100)-oriented. At this time, the length of a side of the unit lattice is represented as a lattice constant $a_c$.

On the other hand, there is assumed a case where a composite oxide that is represented by the general formula (Chemical Formula 4) and has a perovskite-like structure has an orthorhombic crystal structure. Then, there is assumed a case where a first lattice constant $a_o$ among three lattice constants of the orthorhombic crystal is approximately equal to $2^{1/2}$ times the lattice constant $a_c$ of a pseudo-cubic crystal, a second lattice constant $b_o$ among three lattice constants of the orthorhombic crystal is approximately equal to 2 times the lattice constant $a_c$ of the pseudo-cubic crystal, and a third lattice constant $c_o$ among three lattice constants of the orthorhombic crystal is approximately equal to $2^{1/2}$ times the lattice constant $a_c$ of the pseudo-cubic crystal. Note that, in the description of the present application, "a numerical value V1 and a numerical value V2 are approximately equal" means that a ratio of difference between the numerical value V1 and the numerical value V2 relative to an average of the numerical value V1 and the numerical value V2 is approximately not more than 5%.

At this time, "(100)-oriented in the pseudo-cubic representation" means that "(101) oriented or (020) oriented in the orthorhombic representation."

As a consequence of the fact that the film 14 is represented by the general formula (Chemical Formula 4) and satisfies 0≤z≤1, the lattice constant $a_c$ of the pseudo-cubic crystal satisfies 0.390 nm≤$a_c$≤0.393 nm, and thus the film 14 can be (100)-oriented in the pseudo-cubic representation on the conductive film 13.

The piezoelectric film 15 is formed over the conductive film 13 via the film 14 and contains lead zirconate titanate (PZT) as a composite oxide that has a tetragonal crystal structure and that is (001)-oriented. Alternatively, in a case where PZT contained in the piezoelectric film 15 includes a part having a tetragonal crystal structure and a part having a rhombohedral crystal structure, the piezoelectric film 15 may be formed over the conductive film 13 via the film 14 and contain lead zirconate titanate (PZT) as a composite oxide (100)-oriented in the pseudo-cubic representation.

"The piezoelectric film 15 contains PZT" means that the piezoelectric film 15 contains a composite oxide represented by the following general formula (Chemical Formula 5).

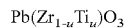 (Chemical Formula 5)

$Pb(Zr_{1-u}Ti_u)O_3$ u satisfies 0<u<1.

Furthermore, in a case where the piezoelectric film 15 contains PZT having a tetragonal crystal structure and being (001)-oriented, in this embodiment, in an X-ray diffraction pattern of the piezoelectric film 15 by the θ-2θ method using a CuKα ray, when a diffraction angle of a diffraction peak of a (004) plane in the tetragonal representation of lead zirconate titanate is denoted as $2θ_{004}$, $2θ_{004}$ satisfies the following formula (Mathematical Formula 1).

$2θ_{004} ≤ 96.5°$ (Mathematical Formula 1)

Accordingly, a space between (004) planes in the tetragonal representation of lead zirconate titanate becomes long. Alternatively, a content percentage of lead zirconate titanate that has a tetragonal crystal structure and that is (001)-oriented (c-axis-oriented) in the piezoelectric film 15 can be made larger than a content percentage of lead zirconate titanate that has a tetragonal crystal structure and that is (100)-oriented (a-axis-oriented) in the piezoelectric film 15. Therefore, a polarization direction of each of plural crystal grains included in the piezoelectric film 15 can be made uniform, and thus a piezoelectric property of the piezoelectric film 15 can be improved.

On the other hand, in a case where the piezoelectric film 15 contains (100)-oriented PZT in the pseudo-cubic representation, the following can be considered.

There is assumed a case where PZT contained in the piezoelectric film 15 has a tetragonal crystal structure, two lattice constants of the tetragonal crystal are $a_t$ and $c_t$, $a_t$ and $c_t$ satisfy $c_t>a_t$, and the unit lattice is a cuboid whose three sides orthogonal to one another are $a_t$, $a_t$ and $c_t$ in length. Furthermore, there is assumed a case where the lattice constant $a_t$ of the tetragonal crystal is approximately equal to the lattice constant $a_c$ of a pseudo-cubic crystal, and the lattice constant $c_t$ of the tetragonal crystal is approximately equal to the lattice constant $a_c$ of the pseudo-cubic crystal. In such a case, "PZT is (100)-oriented in the pseudo-cubic representation" means that PZT is (100)-oriented (a-axis-oriented) or (001)-oriented (c-axis-oriented) in the tetragonal representation.

On the other hand, there is assumed a case where PZT contained in the piezoelectric film 15 has a rhombohedral crystal structure and the lattice constant of the rhombohedral crystal is $a_r$. Then, there is assumed a case where the lattice constant $a_r$ of the rhombohedral crystal is approximately equal to the lattice constant $a_c$ of the pseudo-cubic crystal. In such a case, "PZT is (100)-oriented in the pseudo-cubic representation" means that PZT is (100)-oriented in the rhombohedral representation.

In such a case, in this embodiment, when a diffraction angle of a diffraction peak of a (400) plane in the pseudo-cubic representation of lead zirconate titanate is denoted as $2θ_{400}$ in an X-ray diffraction pattern of the piezoelectric film 15 by the θ-2θ method using a CuKα ray, $2θ_{400}$ satisfies a formula ($2θ_{400} ≤ 96.5°$) obtained by substituting $2θ_{004}$ by $2θ_{400}$ in the above-described formula (Mathematical Formula 1). Then, accordingly, a space between (400) planes in the pseudo-cubic representation of lead zirconate titanate becomes long. Consequently, a content percentage of lead zirconate titanate that has a tetragonal crystal structure and that is (001)-oriented in the piezoelectric film 15 can be made larger than a content percentage of lead zirconate titanate that has a tetragonal crystal structure and that is (100)-oriented in the piezoelectric film 15. Therefore, a polarization direction of each of plural crystal grains included in the piezoelectric film 15 can be made uniform, and thus a piezoelectric property of the piezoelectric film 15 can be enhanced.

Moreover, in this embodiment, in a case where relative permittivity of the piezoelectric film 15 is denoted as $\varepsilon_r$, $\varepsilon_r$ satisfies the following formula (Mathematical Formula 2).

$$\varepsilon_r \leq 450 \qquad \text{(Mathematical Formula 2)}$$

Accordingly, in a case where the film structure body 10 is used as, for example, a pressure sensor utilizing a piezoelectric effect, the detection sensitivity can be enhanced, and the detection circuit of the pressure sensor can easily be designed. Alternatively, in a case where the film structure body 10 is used as, for example, an ultrasonic oscillator utilizing an inverse piezoelectric effect, the oscillation circuit can easily be designed.

In a film structure body having a piezoelectric film containing lead zirconate titanate, in a case where a quality such as crystallinity of the piezoelectric film is not good for the reason that, for example, film density is small, the content of lead zirconate titanate is small, or the like, a piezoelectric property of the piezoelectric film deteriorates. On the other hand, in a film structure body having a piezoelectric film containing lead zirconate titanate, in a case where a quality such as crystallinity of the piezoelectric film is good for the reason that, for example, film density is large, the content of lead zirconate titanate is large, or the like, relative permittivity of the piezoelectric film may not become small although the piezoelectric property of the piezoelectric film is enhanced.

As described above, in a film structure body having a piezoelectric film containing lead zirconate titanate, there is a case where the relative permittivity of the piezoelectric film does not become small when the piezoelectric property of the piezoelectric film is enhanced. Furthermore, when relative permittivity of the piezoelectric film does not become small, in a case where the piezoelectric film is to be used as, for example, a pressure sensor, the detection sensitivity of the pressure sensor deteriorates for the reason that, for example, capacitance of the pressure sensor becomes large, or the like, and it may become difficult to design the detection circuit of the pressure sensor.

In the film structure body 10 of this embodiment, $2\theta_{004}$ satisfies the above-described formula (Mathematical Formula 1), and $\varepsilon_r$ satisfies the above-described formula (Mathematical Formula 2). As a consequence of the fact that $2\theta_{004}$ satisfies the above-described formula (Mathematical Formula 1), a content percentage of lead zirconate titanate that has a tetragonal crystal structure and that is (001)-oriented in the piezoelectric film 15 becomes large, the piezoelectric property can be enhanced. Furthermore, as a consequence of the fact that $\varepsilon_r$ satisfies the above-described formula (Mathematical Formula 2), the relative permittivity becomes small to thereby make it possible to increase the detection sensitivity of a pressure sensor. Therefore, according to the film structure body 10 of this embodiment, it is possible to enhance the piezoelectric property, and to enhance the detection sensitivity of a sensor using a piezoelectric effect. Namely, in a film structure body having a piezoelectric film containing lead zirconate titanate, it is possible to enhance the piezoelectric property of the piezoelectric film, and to enhance the detection sensitivity of a pressure sensor using the piezoelectric film.

As described in the above-described Non-Patent Literature 2, in a case of $PbTiO_3$, the relative permittivity decreases when $PbTiO_3$ is put into a single crystal state and crystallinity including orientation etc. is enhanced. Therefore, it is considered that, also in PZT, the relative permittivity decreases as a consequence of enhancement of crystallinity including orientation of a thin film, as with $PbTiO_3$. Namely, a fact that relative permittivity $\varepsilon_r$ of the film structure body 10 decreases to 450 or less shows that the piezoelectric film 15 being a piezoelectric film containing lead zirconate titanate has been put into a single crystal state.

Preferably, in a case where the film structure body 10 has the conductive film 18, when relative permittivity of the piezoelectric film 15 to be measured by applying an alternating voltage having a frequency of 1 kHz between the conductive film 13 and the conductive film 18 is denoted as $\varepsilon_r$, $\varepsilon_r$ of the piezoelectric film 15 satisfies the above-described formula (Mathematical Formula 2). As a consequence of the fact that the relative permittivity on the basis of an alternating voltage having such frequency becomes small, for example, it is possible to enhance a clock frequency of a detection circuit, and to enhance response speed of a pressure sensor using the film structure body 10.

In a case where the film structure body 10 has the conductive film 18, a ferroelectric capacitor CP1 is formed with the conductive film 13, the piezoelectric film 15 and the conductive film 18. Then, $\varepsilon_r$ of the piezoelectric film 15 is calculated on the basis of an electrostatic capacitance of the ferroelectric capacitor CP1 when an alternating voltage having a frequency of 1 kHz is applied between the conductive film 13 and the conductive film 18.

Preferably, when a residual polarization value of the piezoelectric film 15 is denoted as $P_r$, $P_r$ satisfies the following formula (Mathematical Formula 3).

$$P_r \geq 28 \,\mu C/cm^2 \qquad \text{(Mathematical Formula 3)}$$

A residual polarization value is a value to be an index of ferroelectric properties of a piezoelectric body that is also a ferroelectric substance, and generally, a piezoelectric film that is excellent in a ferroelectric property is also excellent in a piezoelectric property. Therefore, as a consequence of the fact that $P_r$ of the piezoelectric film 15 satisfies the above-described formula (Mathematical Formula 3), the ferroelectric property of the piezoelectric film 15 can be enhanced, and thus the piezoelectric property of the piezoelectric film 15 can also be enhanced.

Note that, $P_r$ preferably satisfies $P_r \geq 40 \,\mu C/cm^2$, more preferably satisfies $P_r \geq 50 \,\mu C/cm^2$, and further more preferably satisfies $P_r \geq 55 \,\mu C/cm^2$. As $P_r$ becomes larger, the ferroelectric property of the piezoelectric film 15 can be further enhanced, and thus the piezoelectric property of the piezoelectric film 15 can also be further enhanced.

In a case where the film structure body 10 has the conductive film 18, when a polarization voltage hysteresis curve (refer to FIG. 6 to be described later) showing variation of polarization of the piezoelectric film 15 when a voltage applied between the conductive film 13 and the conductive film 18 is varied, is to be measured, a polarization value when a voltage applied between the conductive film 13 and the conductive film 18 is increased from 0 to a plus side and is returned again to 0, is a residual polarization value $P_r$ of the piezoelectric film 15. Furthermore, a polarization value when a voltage applied between the conductive film 13 and the conductive film 18 is decreased from 0 to a minus side and is returned again to 0, is a residual polarization value $-P_r$ of the piezoelectric film 15.

Namely, when a polarization electric field hysteresis curve showing variation of polarization of the piezoelectric film 15 when an electric field applied to the piezoelectric film 15 is varied, is to be measured, a polarization value when an electric field applied to the piezoelectric film 15 is increased from 0 to a plus side and is returned again to 0, is the residual polarization value $P_r$ of the piezoelectric film 15. Furthermore, a polarization value when an electric field applied to the piezoelectric film 15 is decreased from 0 to a minus side and is returned again to 0, is the residual polarization value $-P_r$ of the piezoelectric film 15.

As shown in FIG. 2, in a case where the film structure body 10 has the conductive film 18, the ferroelectric capacitor CP1 is formed with the conductive film 13, the piezoelectric film 15 and the conductive film 18. In such a case, $P_r$ of the piezoelectric film 15 is the residual polarization value of the ferroelectric capacitor CP1.

Preferably, the piezoelectric film 15 includes a piezoelectric film 16 and a piezoelectric film 17. The piezoelectric film 16 includes a composite oxide that is formed on the film 14 and that is composed of lead zirconate titanate. The piezoelectric film 17 includes a composite oxide that is formed on the piezoelectric film 16 and that is composed of lead zirconate titanate. The piezoelectric film 16 has compression stress, and the piezoelectric film 17 has tensile stress.

There is assumed a case where the piezoelectric film 16 has tensile stress and the piezoelectric film 17 has tensile stress. In such a case, the film structure body 10 easily warps so as to have a downward convex shape, when the upper surface 11a of the substrate 11 is set to a principal surface. Accordingly, for example, shape accuracy lowers when the film structure body 10 is processed using a photolithographic technology, and lowers properties of a piezoelectric element to be formed by processing the film structure body 10.

Moreover, there is assumed a case where the piezoelectric film 16 has compression stress and the piezoelectric film 17 has compression stress. In such a case, the film structure body 10 easily warps so as to have an upward convex shape when the upper surface 11a of the substrate 11 is set to a principal surface. Accordingly, for example, shape accuracy lowers when the film structure body 10 is processed using a photolithographic technology, and lowers properties of a piezoelectric element to be formed by processing the film structure body 10.

On the other hand, in this embodiment, the piezoelectric film 16 has compression stress, and the piezoelectric film 17 has tensile stress. Thereby, as compared with a case where each of the piezoelectric film 16 and the piezoelectric film 17 has tensile stress, an amount of warpage when the film structure body 10 warps can be reduced, and, as compared with a case where each of the piezoelectric film 16 and the piezoelectric film 17 has compression stress, an amount of warpage when the film structure body 10 warps can be reduced. Accordingly, for example, it is possible to enhance shape accuracy when the film structure body 10 is processed using a photolithographic technology, and to enhance properties of a piezoelectric element to be formed by processing the film structure body 10.

Meanwhile, the fact that the piezoelectric film 16 has compression stress and the piezoelectric film 17 has tensile stress can be confirmed as a consequence of the fact that, for example, when the piezoelectric film 17 and the piezoelectric film 16 are sequentially removed from the film structure body 10, the shape of the substrate 11 is changed from a downward convex side to an upward convex side before and after the removal of the piezoelectric film 17, and that the shape of the substrate 11 is changed from an upward convex side to a downward convex side before and after the removal of the piezoelectric film 16.

Preferably, the piezoelectric film 16 contains a composite oxide that is represented by the following general formula (Chemical Formula 6) and that is composed of lead zirconate titanate (PZT).

$$Pb(Zr_{1-x}Ti_x)O_3 \quad \text{(Chemical Formula 6)}$$

Here, x satisfies $0.32 \leq x \leq 0.52$.

In this range, when x satisfies $0.32 \leq x \leq 0.48$, PZT contained in the piezoelectric film 16 has primarily a composition of exhibiting a rhombohedral crystal structure, but tends to have a tetragonal crystal structure and to be (001)-oriented mainly due to a binding power from the substrate 11 etc. Then, a piezoelectric film 16 containing PZT is epitaxially grown on the film 14. Note that, in a case where x satisfies $0.48 < x \leq 0.52$, PZT contained in the piezoelectric film 16 has primarily a composition of exhibiting a tetragonal crystal structure, and thus has a tetragonal crystal structure and is (001)-oriented. Then, the piezoelectric film 16 containing PZT is epitaxially grown on the film 14. Accordingly, a polarization axis of lead zirconate titanate contained in the piezoelectric film 16 can be oriented approximately perpendicularly to the upper surface 11a, and thus the piezoelectric property of the piezoelectric film 16 can be enhanced.

Moreover, preferably, the piezoelectric film 17 contains a composite oxide that is represented by the following general formula (Chemical Formula 7) and that is composed of lead zirconate titanate (PZT).

$$Pb(Zr_{1-y}Ti_y)O_3 \quad \text{(Chemical Formula 7)}$$

Here, y satisfies $0.32 \leq y \leq 0.52$.

In this range, in a case where y satisfies $0.32 \leq y \leq 0.48$, PZT contained in the piezoelectric film 17 primarily a composition of exhibiting a rhombohedral crystal structure, but tends to have a tetragonal crystal structure and to be (001)-oriented mainly due to a binding power from the substrate 11 etc. Then, a piezoelectric film 17 containing PZT is epitaxially grown on the piezoelectric film 16. Note that, in a case where y satisfies $0.48 < y \leq 0.52$, PZT contained in the piezoelectric film 17 has primarily a composition of exhibiting a tetragonal crystal structure, and thus has a tetragonal crystal structure and is (001)-oriented. Then, the piezoelectric film 17 containing PZT is epitaxially grown on the piezoelectric film 16. Accordingly, a polarization axis of lead zirconate titanate contained in the piezoelectric film 17 can be oriented approximately perpendicularly to the upper surface 11a, and thus the piezoelectric property of the piezoelectric film 17 can be enhanced.

As will be explained using FIG. 13 to be described later, the piezoelectric film 16 having compression stress can be formed by, for example, a sputtering method. In addition, the piezoelectric film 17 having tensile stress can be formed by a coating method such as a sol-gel method, as will be explained using FIG. 1 when a manufacturing method of a film structure body is explained.

Figure 5:
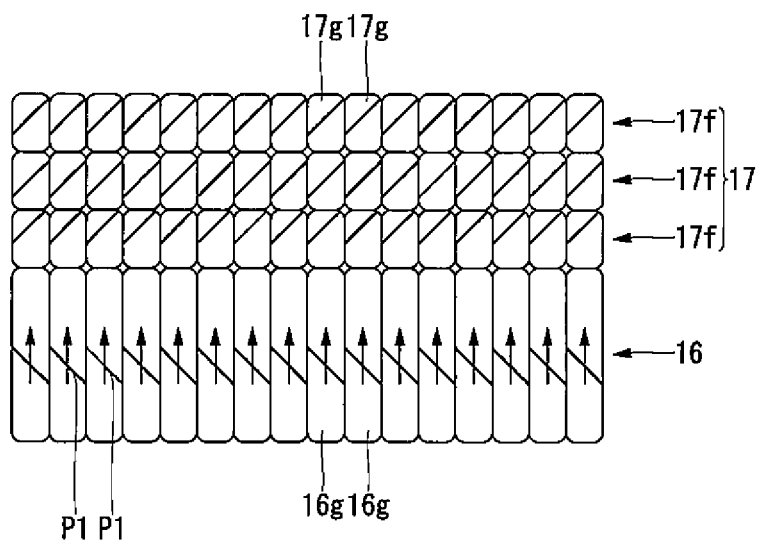
FIG. 5 is a view schematically showing cross-sectional structures of two piezoelectric films included in the film structure body of the embodiment.

FIG. 5 is a view schematically showing cross-sectional structures of two piezoelectric films included in the film structure body of the embodiment. FIG. 5 schematically shows the piezoelectric film 16 and the piezoelectric film 17 among observation images in which cross-sections, namely, fracture surfaces formed by cleaving the substrate 11 included in the film structure body 10 of the embodiment shown in FIG. 1 are observed with a scanning electron microscope (SEM).

Figure 6:
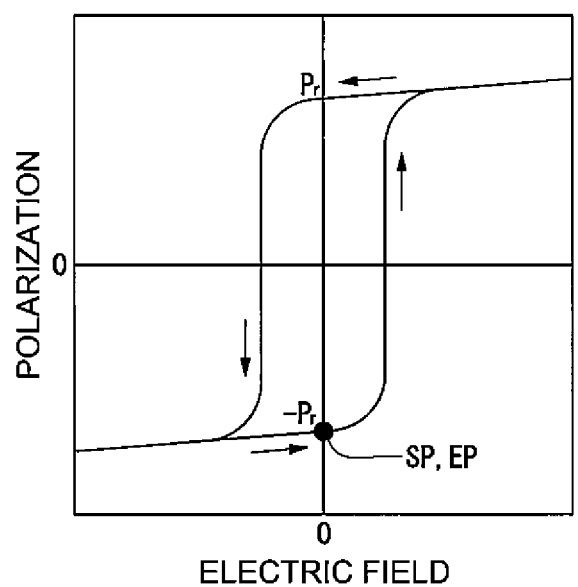
FIG. 6 is a graph schematically showing electric field dependency of polarization of the piezoelectric film included in a film structure body of the embodiment.

FIG. 6 is a graph schematically showing electric field dependency of polarization of the piezoelectric film included in the film structure body of the embodiment. FIG. 6 is a graph schematically showing a polarization electric field hysteresis curve that shows variation in polarization of the piezoelectric film 15 when an electric field between a lower electrode (the conductive film 13) and an upper electrode (the conductive film 18) included in the film structure body 10 of the embodiment shown in FIG. 2 is varied.

As shown in FIG. 5, when the piezoelectric film 16 is formed by a sputtering method, the piezoelectric film 16 contains plural crystal grains 16g, each being integrally formed from the lower surface to the upper surface of the piezoelectric film 16. Furthermore, a hole or a void is less likely to remain between two crystal grains 16g adjacent to each other in the principal surface of the substrate 11 (the upper surface 11a in FIG. 1). Accordingly, in a case where a cross-section to be observed with a SEM is formed on the piezoelectric film 16 by performing processing by a focused ion beam (FIB) method, the cross-section easily appears as a single cross-section and the crystal grains 16g are less likely to be observed.

On the other hand, when the piezoelectric film 17 is formed by a coating method, the piezoelectric film 17 includes plural films 17f as layers stacked each other in the thickness direction of the piezoelectric film 17. The film 17f as each of plural layers contains plural crystal grains 17g each being integrally formed from the lower surface to the upper surface of one layer of the film 17f. In addition, a hole or a void may remain between two films 17f adjacent to each other in the thickness direction of the piezoelectric film 17.

As shown in FIG. 5, preferably, each of plural crystal grains has spontaneous polarization. This spontaneous polarization includes a polarization component P1 that is parallel to the thickness direction of the piezoelectric film 16, and the polarization component P1 included in spontaneous polarization of each of plural crystal grains faces the same direction as each other.

In such a case, as shown in FIG. 6, the piezoelectric film 15 has large spontaneous polarization in an initial state. Accordingly, a hysteresis curve showing electric field dependency of polarization of the piezoelectric film 15 in a case where an electric field is increased from a starting point SP at which the electric field is 0 to the plus side and is returned again to 0, and then the electric field is decreased to the minus side and is returned again to 0 being an endpoint EP, shows a curve with a point separated from the original point, as the starting point SP. Therefore, in a case where the film structure body 10 of this embodiment is used as a piezoelectric element, it is unnecessary to subject the piezoelectric film 15 to a polarization treatment prior to use.

It is considered that the reason why the piezoelectric film 15 has a large spontaneous polarization in the initial state as described above is that plasma or electrons are less likely to be affected by a ground potential (zero potential) and are easily encaged stably between a target and a substrate, for example, when the piezoelectric film 16 is formed using a film deposition apparatus as an RF sputtering apparatus to be explained later using FIGS. 7 to 9.

The lattice constant of Si contained in the substrate 11, the lattice constant of $ZrO_2$ contained in the orientation film 12, the lattice constant of Pt contained in the conductive film 13, the lattice constant of SRO contained in the film 14, and the lattice constant of PZT contained in the piezoelectric film 15 are listed in Table 1.

TABLE 1

| MATERIAL | LATTICE CONSTANT (nm) |
|---|---|
| PZT | 0.411 |
| SRO | 0.390~0.393 |
| Pt | 0.392(0.554) |
| $ZrO_2$ | 0.511 |
| Si | 0.543 |

As shown in Table 1, the lattice constant of Si is 0.543 nm, the lattice constant of $ZrO_2$ is 0.511 nm, and mismatching of the lattice constant of $ZrO_2$ relative to the lattice constant of Si is as small as 6.1%, and thus the matching property of the lattice constant of $ZrO_2$ relative to the lattice constant of Si is good. Accordingly, it is possible to cause the orientation film 12 containing $ZrO_2$ to grow epitaxially on the upper surface 11a as the principal surface composed of the (100) plane of the substrate 11 containing a silicon single crystal. Therefore, it is possible to cause the orientation film 12 containing $ZrO_2$ to be (100)-oriented with a cubic crystal structure on the (100) plane of the substrate 11 containing a silicon single crystal, and to enhance crystallinity of the orientation film 12.

It is assumed that the orientation film 12 includes a zirconium oxide film having a cubic crystal structure and being (100)-oriented.

On the other hand, it is also considered that, as shown in Table 1, the lattice constant of $ZrO_2$ is 0.511 nm and the lattice constant of Pt is 0.392 nm, but that Pt having been rotated by 45° in a plane gives a diagonal length of 0.554 nm and mismatching of the diagonal length relative to the lattice constant of $ZrO_2$ is as small as 8.1% to thereby make it possible to epitaxially grow the conductive film 13 containing Pt on the (100) plane of the orientation film 12 containing $ZrO_2$. For example, in the above-described Patent Literature 2 and the above-described Non-Patent Literature 1, it is reported that the <100> direction in a plane of an LSCO film, although not a Pt film, composed of LSCO having a lattice constant (0.381 nm) that is approximately the same degree of the lattice constant of Pt is oriented so as to be parallel to the <110> direction in the principal surface of a silicon substrate.

Note that, by adjustment of conditions when $ZrO_2$ is formed or conditions when Pt is formed, the conductive film 13 containing Pt can also be epitaxially grown on a (100) plane of the orientation film 12 containing $ZrO_2$ in a state where Pt is rotated by 45° in a flat plane, that is, in a state where the <100> direction of Pt is along the <110> direction of Si in the principal surface of the substrate 11.

Furthermore, as shown in Table 1, the lattice constant of Pt is 0.392 nm and the lattice constant of SRO is 0.390 to 0.393 nm, and since mismatching of the lattice constant of PZT relative to the lattice constant of Pt is as small as not more than 0.5%, the lattice constant of SRO matches well with the lattice constant of Pt. Accordingly, the film 14 containing SRO can be epitaxially grown on a (100) plane of the conductive film 13 containing Pt. Therefore, the film 14 containing SRO can be (100)-oriented in the pseudo-cubic representation on a (100) plane of the conductive film 13 containing Pt and thus the crystallinity of the film 14 can be enhanced.

The film 14 is assumed to include an SRO film having pseudo-cubic crystal structure and being (100)-oriented.

Moreover, as shown in Table 1, the lattice constant of SRO is 0.390 to 0.393 nm and the lattice constant of PZT is 0.411 nm, and since mismatching of the lattice constant of PZT relative to the lattice constant of SRO is as small as 4.5 to 5.2%, the lattice constant of PZT matches well with the lattice constant of SRO. Accordingly, the piezoelectric film 15 containing PZT can be epitaxially grown on a (100) plane of the film 14 containing SRO. Therefore, the piezoelectric film 15 containing PZT can be (001)-oriented in the tetragonal representation or (100)-oriented in the pseudo-cubic representation, on a (100) plane of the film containing SRO and thus the crystallinity of the piezoelectric film 15 can be enhanced.

The piezoelectric film 15 is assumed to include a lead zirconate titanate film having a tetragonal crystal structure and being (001)-oriented.

Note that a film containing lead zirconate titanate may be formed between the film 14 and the piezoelectric film 15. The film may contain a composite oxide represented by the following general formula (Chemical Formula 8) and (100)-oriented in the pseudo-cubic representation.

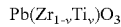
$Pb(Zr_{1-v}Ti_v)O_3$ (Chemical Formula 8)

Here, v satisfies $0 \leq v \leq 0.1$.

Accordingly, the piezoelectric film 15 containing PZT can be further easily (001)-oriented in the tetragonal representation, or (100)-oriented in the pseudo-cubic representation, on a (100) plane of the film 14 containing SRO, and thus the crystallinity of the piezoelectric film 15 can be further easily enhanced.

<Film Deposition Apparatus>

Next, there will be explained a film deposition apparatus for forming the piezoelectric film 16 of the piezoelectric film 15 included in the above-described film structure body capable of enhancing a piezoelectric property of a piezoelectric film and enhancing detection sensitivity of a pressure sensor using the piezoelectric film. The film deposition apparatus is a sputtering apparatus that deposits a film containing lead zirconate titanate on a surface of a substrate by sputtering of a surface of a target containing lead zirconate titanate, inside a chamber.

Note that, hereinafter, as a film deposition apparatus for forming the piezoelectric film 16, there will be explained an example applied to a so-called face-down type sputtering apparatus that performs sputtering of an upper surface of a target arranged facing a lower surface of a substrate to thereby deposit a film on the lower surface of the substrate, inside a chamber. However, a film deposition apparatus for forming the piezoelectric film 16 can also be applied to a so-called face-up type sputtering apparatus that performs sputtering of a lower surface of a target arranged facing an upper surface of a substrate to thereby deposit a film on the upper surface of the substrate, inside a chamber.

Figure 7:
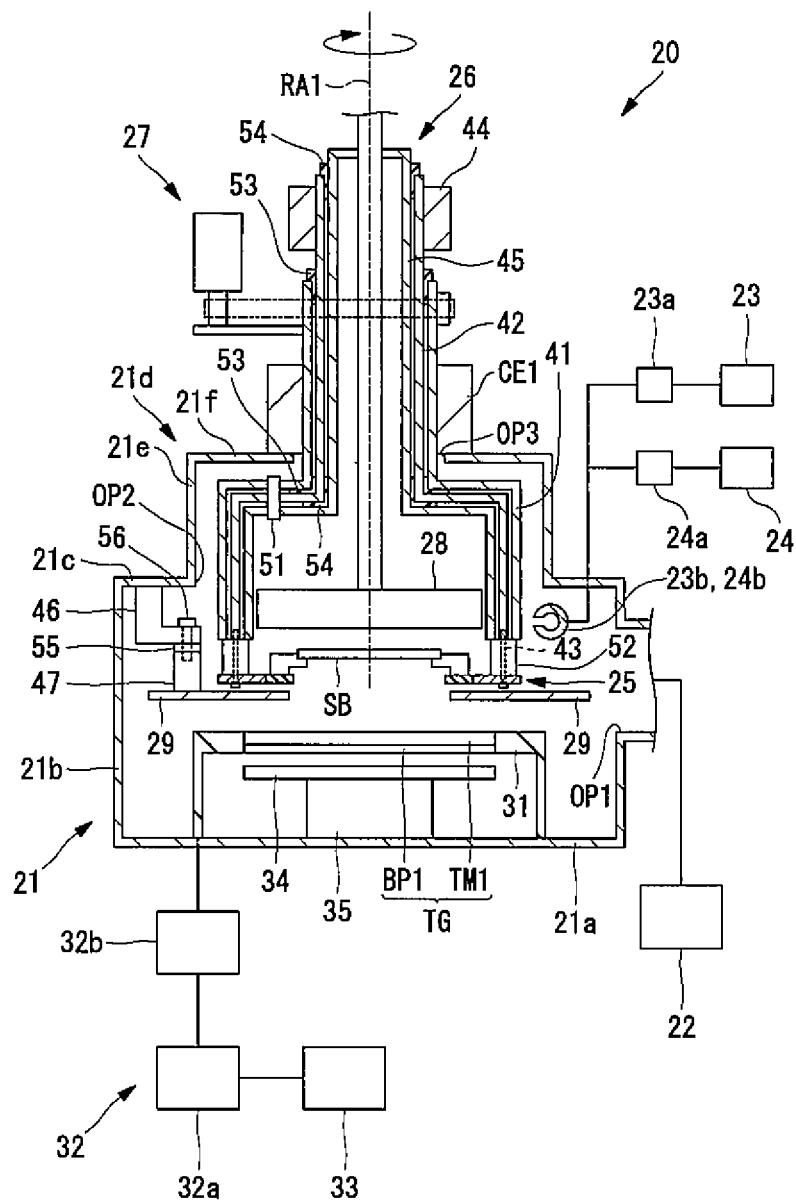
FIG. 7 is a cross-sectional view schematically showing a film deposition apparatus in the embodiment.
Figure 8:
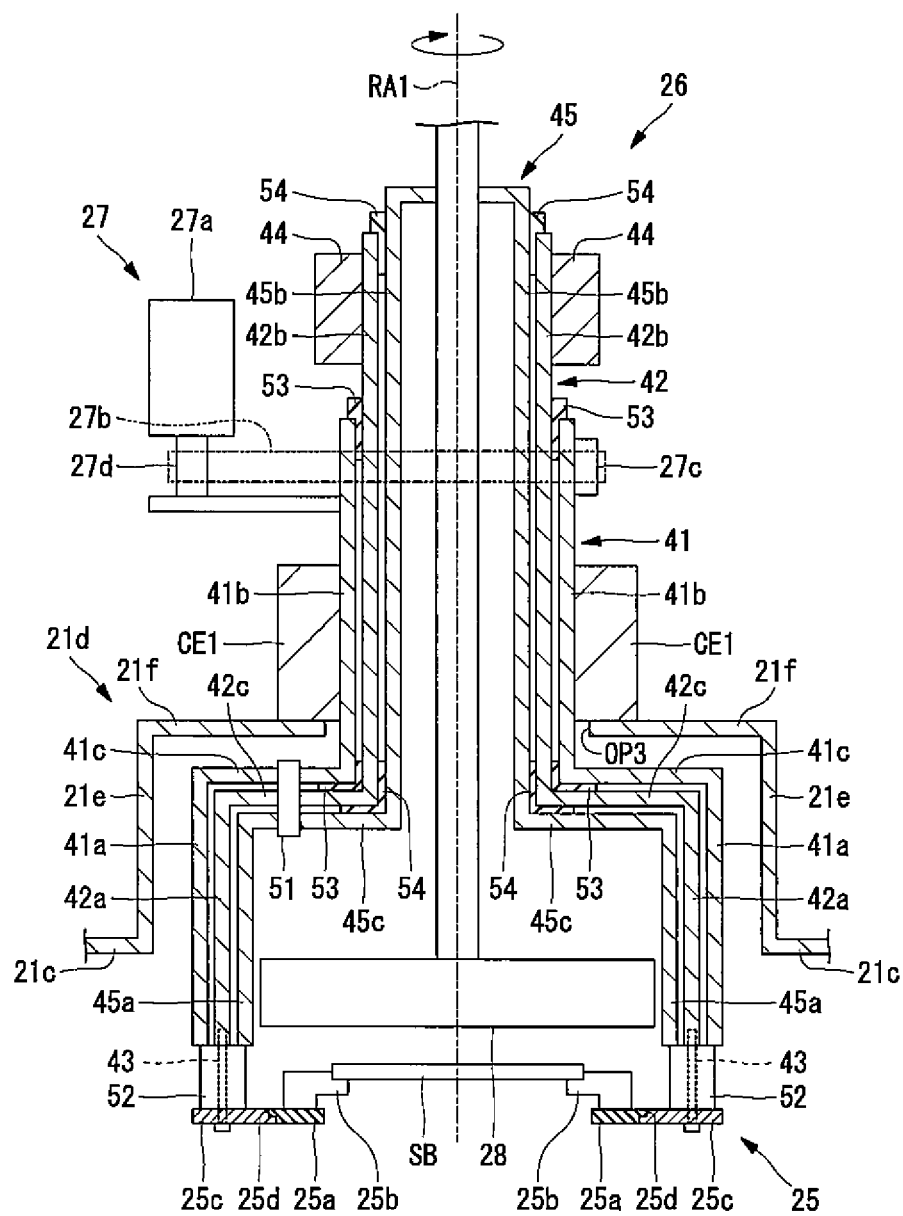
FIG. 8 is a cross-sectional view schematically showing a film deposition apparatus in the embodiment.
Figure 9:
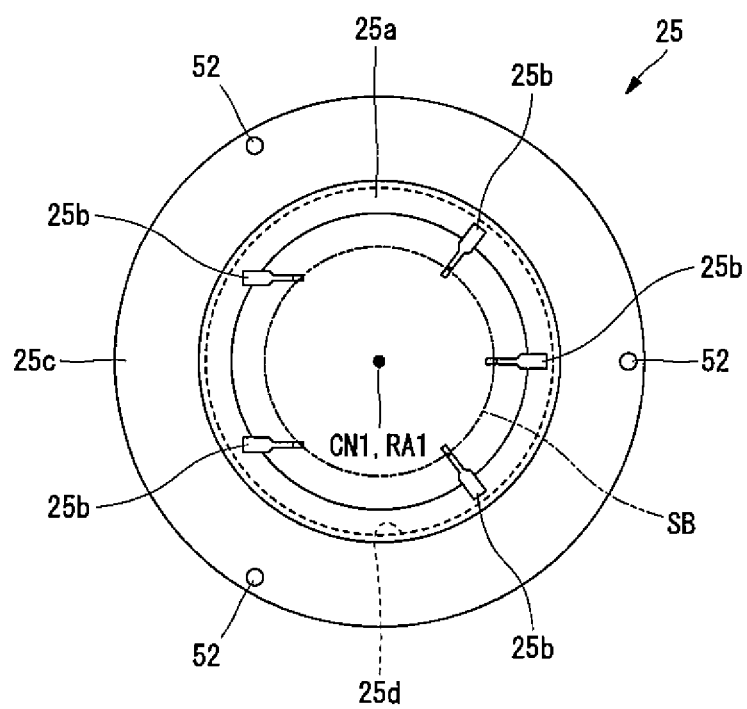
FIG. 9 is a plan view showing a substrate-holding part of a film deposition apparatus in the embodiment.

FIGS. 7 and 8 are cross-sectional views schematically showing the film deposition apparatus of the embodiment. FIG. 8 shows, in the cross-sectional view of FIG. 7, the vicinity of a substrate-holding part 25 and a support part 26 in an enlarged manner. FIG. 9 is a plan view showing the substrate-holding part of the film deposition apparatus of the embodiment.

As shown in FIG. 7, a film deposition apparatus 20 has a chamber 21, a vacuum evacuation part 22, gas supply parts 23 and 24, a substrate-holding part 25, a support part 26, a rotation drive part 27, a substrate-heating part 28, a deposition-preventive plate 29, a target-holding part 31, and a power supply part 32. The substrate-holding part 25 holds a substrate SB. As the substrate SB, there can be used, for example, a film structure body obtained by forming the orientation film 12, the conductive film 13 and the film 14 over the above-described substrate 11.

The chamber 21 is provided so as to be capable of being subjected to vacuum evacuation. The vacuum evacuation part 22 subjects the chamber 21 to vacuum evacuation. The gas supply part 23 supplies rare gas such as argon (Ar) gas into the chamber 21. The gas supply part 24 supplies raw material gas such as oxygen ($O_2$) gas or nitrogen ($N_2$) gas into the chamber 21.

The chamber 21 includes, for example, a bottom plate part 21a, a side plate part 21b, and a top plate part 21c. An opening OP1 is formed at the side plate part 21b, and the vacuum evacuation part 22 for subjecting the chamber 21 to vacuum evacuation is connected to the opening OP1. For example, a cryopump can be used as the vacuum evacuation part 22.

In an example shown in FIG. 7, an opening OP2 is provided at the top plate part 21c, and the chamber 21 includes a lid part 21d that airtightly covers the opening OP2. The lid part 21d includes, for example, a side plate part 21e and a top plate part 21f. A space formed inside the chamber 21 communicates with a space enclosed with the side plate part 21e and the top plate part 21f. An opening OP3 is provided at the top plate part 21f. Note that, although illustration is omitted, a carry-in port for carrying the substrate SB into the chamber 21 is formed at the side plate part 21b.

The gas supply part 23 is connected to a gas supply tube 23b via a flow rate controller 23a, and the rare gas supplied from the gas supply part 23 is subjected to flow-rate adjustment by the flow rate controller 23a and is supplied from the gas supply tube 23b into the chamber 21. In addition, the gas supply part 24 is connected to a gas supply tube 24b via a flow rate controller 24a, and the raw material gas supplied from the gas supply part 24 is subjected to flow-rate adjustment by the flow rate controller 24a and is supplied from the gas supply tube 24b into the chamber 21. Note that, in the example shown in FIG. 7, there is illustrated a case where the gas supply tube 23b and the gas supply tube 24b are the same, but the gas supply tube 23b and the gas supply tube 24b may be separately provided.

The substrate-holding part 25 holds the substrate SB inside the chamber 21. As shown in FIGS. 7 to 9, the substrate-holding part 25 holds the substrate SB in a state where an outer peripheral part of the substrate SB is in contact with the substrate-holding part 25, and a central part of the substrate SB is separated from the substrate-holding part 25.

There is assumed a case where the substrate-holding part 25 overlaps with, for example, the whole lower surface of the substrate SB in plan view and the substrate-holding part 25 is in contact with, for example, the whole lower surface of the substrate SB. In such a case, the central part of the substrate SB is less likely to be thermally insulated from the substrate-holding part 25, and is easily thermally affected by the substrate-holding part 25. In addition, since the central part of the substrate SB is easily affected by the heat capacity of the substrate-holding part 25, temperature of the central part of the substrate SB is less likely to be controlled. Accordingly, due to shifting or the like of actual temperature of the central part of the substrate SB from a targeted temperature when the substrate SB is to be heated with the substrate-heating part 28, variation is generated in quality such as crystallinity of a film to be deposited on the surface of the substrate SB.

On the other hand, in this embodiment, although the outer peripheral part of the substrate SB comes into contact with the substrate-holding part 25, the central part of the substrate SB is separated from the substrate-holding part 25. In a case, the central part of the substrate SB is easily thermally insulated from the substrate-holding part 25 and is less likely to be thermally affected by the substrate-holding part 25. Furthermore, since the central part of the substrate SB is less likely to be affected by the heat capacity of the substrate-holding part 25, temperature of the central part of the substrate SB can easily be controlled. Accordingly, shifting of the actual temperature of the central part of the substrate SB from a targeted temperature can be prevented or suppressed when the substrate SB is to be heated with the substrate-heating part 28, and thus generation of variation in quality such as crystallinity of a film to be deposited on the surface of the substrate SB can be prevented or suppressed.

As aforementioned, the film deposition apparatus 20 of this embodiment is a so-called face-down type sputtering apparatus that performs sputtering of the upper surface of a target TG arranged facing a lower surface of a substrate SB to thereby deposit a film on the lower surface of the substrate SB, inside the chamber 21. In such a case, as a consequence of the fact that, for example, the substrate-holding part 25 does not overlap with the lower surface of the substrate SB in plan view, a film can be deposited on the central part of the lower surface of the substrate SB.

Although a shape of the substrate-holding part 25 is not particularly limited, preferably the substrate-holding part 25 includes: an insulating enclosure part 25a that is composed of an insulating member and that encloses the substrate SB in plan view; and plural protruding parts 25b each of which is composed of an insulating member and protrudes from the insulating enclosure part 25a toward the center side of the substrate SB in plan view. Namely, the substrate-holding part 25 preferably has a shape of so-called trivet. Furthermore, the substrate-holding part 25 preferably holds the substrate SB in a state where the outer peripheral part (outer edge part) of the lower surface of the substrate SB comes into contact with each upper surface of the plural protruding parts 25b. The plural protruding parts 25b are preferably arranged so that the center of gravity of the substrate SB held with the plural protruding parts 25b is arranged inside a polygon formed by sequentially linking the plural protruding parts 25b in plan view.

In such a case, no part of the substrate-holding part 25 is arranged under the central part of the substrate SB and thus the central part of the substrate SB is further easily thermally insulated from the substrate-holding part 25, and is further less likely to be thermally affected by the substrate-holding part 25. Furthermore, since the central part of the substrate SB is further less likely to be affected by the heat capacity of the substrate-holding part 25, the temperature of the central part of the substrate SB is further easily controlled. Accordingly, shifting of the actual temperature of the central part of the substrate SB from a targeted temperature can be further prevented or suppressed when the substrate SB is to be heated with the substrate-heating part 28, and thus generation of variation in quality such as crystallinity of a film to be deposited on the surface of the substrate SB can be further prevented or suppressed.

Although the insulating member of the insulating enclosure part 25a and each insulating member of the plural protruding parts 25b are not particularly limited, for example, the use of quartz such as molten quartz or synthetic quartz, or alumina (aluminum oxide) is preferable. Among these, in a case where the substrate SB is composed of silicon substrate, each insulating member of the plural protruding parts 25b is more preferably made of quartz from the viewpoint that the contact with the substrate SB does not result in contamination of the substrate SB.

Moreover, the substrate-holding part 25 may further include a conductive enclosure part 25c that is composed of a conductive member and that encloses the insulating enclosure part 25a. The substrate-holding part 25 may be formed as a consequence of the fact that a step part 25d is formed at an inner edge part of the conductive enclosure part 25c and an outer edge part of the insulating enclosure part 25a is held with the step part 25d.

As the substrate SB held with the substrate-holding part 25, there can be used a substrate SB composed of a wafer having a circular shape in plan view. At this time, the substrate-holding part 25 rotatably holds the substrate SB in a state where a rotary shaft RA1 passes through the center CN1 of the surface of the substrate SB (refer to FIG. 9).

Note that a direction in which the rotary shaft RA1 extends can be set to a direction parallel to the vertical direction. At this time, the surface of the substrate SB held with the substrate-holding part 25 is parallel to the horizontal surface.

The support part 26 is attached to the chamber 21, and supports the substrate-holding part 25 inside the chamber 21. The support part 26 includes a conductive member (conductive members 41 and 42 to be described later) that is attached to the chamber 21, and that supports the substrate-holding part 25 inside the chamber 21. The support part 26 is rotatably provided integrally with the substrate-holding part 25 around the rotary shaft RA1 that is perpendicular to the surface of the substrate SB. The rotation drive part 27 rotationally drives the support part 26.

In the example shown in FIGS. 7 and 8, the support part 26 includes the conductive member 41 attached to the chamber 21 and the conductive member 42 attached to the conductive member 41, as conductive members. The conductive members 41 and 42 are rotatably provided integrally with the substrate-holding part 25 around the rotary shaft RA1. The rotation drive part 27 rotationally drives the conductive members 41 and 42.

The conductive member 41 includes a base part 41a having a cylindrical shape, and a shaft part 41b that has a cylindrical shape, that is rotatably provided integrally with the base part 41a, and that has a diameter smaller than the diameter of the base part 41a. Furthermore, the conductive member 41 includes a connection part 41c that has an annular shape and that connects the base part 41a with the shaft part 41b. The base part 41a, the shaft part 41b and the connection part 41c are integrally formed, and the base part 41a, the shaft part 41b and the connection part 41c are made of metal such as stainless steel.

The conductive member 41 is provided so that the shaft part 41b protrudes upward from the opening OP3 of the lid part 21d, and the shaft part 41b protruding upward from the opening OP3 is attached airtightly to the opening OP3, by a sealing part CE1 composed of, for example, a magnetic fluid seal. Furthermore, the shaft part 41b is rotatably provided, by the sealing part CE1, around the rotary shaft RA1 that is perpendicular to the surface of the substrate SB. Accordingly, the shaft part 41b is attached to the lid part 21d, that is, to the chamber 21. At this time, the shaft part 41b is electrically connected with the chamber 21. As aforementioned, the chamber 21 is made of metal such as stainless steel, and is grounded. Consequently, the conductive member 41 is also grounded.

The rotation drive part 27 includes, for example, a motor 27a, a belt 27b, and a pulley 27c. The shaft part 41b is connected to a rotary shaft 27d of the motor 27a via the pulley 27c and the belt 27b. As a consequence of transmission of a rotational driving force of the motor 27a to the shaft part 41b via the belt 27b and the pulley 27c, the rotation drive part 27 rotationally drives the conductive member 41 around the rotary shaft RA1.

The conductive member 42 includes a base part 42a having a cylindrical shape, and a shaft part 42b that has a cylindrical shape, that is rotatably provided integrally with the base part 42a, and that has a diameter smaller than the diameter of the base part 42a. In addition, the conductive member 42 includes a connection part 42c that has an annular shape and that connects the base part 42a with the shaft part 42b. The base part 42a, the shaft part 42b and the connection part 42c are integrally formed, and the base part 42a, the shaft part 42b and the connection part 42c are made of metal such as stainless steel.

The base part 42a is provided concentrically with the base part 41a so that the outer peripheral surface of the base part 42a faces the inner peripheral surface of the base part 41a. The shaft part 42b is provided concentrically with the shaft part 41b so that the outer peripheral surface of the shaft part 42b faces the inner peripheral surface of the shaft part 41b. The connection part 42c is fixed to the connection part 41c by an insulating member 51, and accordingly, the conductive member 42 is rotatably provided integrally with the conductive member 41. As the insulating member 51, there can be used an insulating member made of, for example, alumina (aluminum oxide).

The base part 42a is fixed to the substrate-holding part 25 through the use of, for example, a screw 43 composed of a conductive member. Accordingly, in a case where the substrate-holding part 25 has the conductive enclosure part 25c, that is, a conductive property, the electric potential of the conductive enclosure part 25c, that is, the substrate-holding part 25 becomes equal to the electric potential of the base part 42a, that is, the conductive member 42. Alternatively, in a case where the substrate-holding part 25 does not have the conductive enclosure part 25c, that is, a conductive property, an electric potential of a part in contact with the screw 43 in the substrate-holding part 25 becomes equal to the electric potential of the base part 42a, that is, the conductive member 42.

Moreover, as aforementioned, as a consequence of the fact that the conductive member 42 is fixed to the substrate-holding part 25 through the use of, for example, the screw 43 composed of a conductive member, the conductive member 41 attached to the chamber 21 supports the substrate-holding part 25 via the insulating member 51, the conductive member 42 and the screw 43. At this time, the insulating member 51 is interposed between the conductive member 41 and the substrate-holding part 25.

Moreover, as a consequence, the conductive member 42 supports the substrate-holding part 25 via the screw 43. At this time, the insulating member 51 is interposed between the chamber 21 and the conductive member 42, and the conductive member 42 electrically floats.

Note that an insulating member 52 is provided around the screw 43 composed of a conductive member. As the insulating member 52, there can be used an insulating member made of, for example, alumina. At this time, the insulating member 52 is arranged between the conductive member 41 and the substrate-holding part 25, and thus it can also be said that the insulating member 52 is interposed between the conductive member 41 and the substrate-holding part 25.

There is assumed a case where the insulating member 51 is not interposed between the conductive member 41 and the substrate-holding part 25, and the conductive member 41 is in electrical contact with the substrate-holding part 25. In such a case and in a case where the substrate-holding part has the conductive enclosure part 25c, that is, a conductive property, the conductive enclosure part 25c, that is, the substrate-holding part 25 is put into a grounded state, and the electric potential of the conductive enclosure part 25c, that is, the substrate-holding part 25 becomes zero potential. Accordingly, when plasma is generated inside the chamber 21 to perform sputtering of the target TG, plasma or electrons are easily affected by the ground potential (zero potential) and are less likely to be stably encaged between the target TG and the substrate SH. Therefore, for example, in a case where a piezoelectric film such as lead zirconate titanate is to be formed, distribution of charges in the piezoelectric film during deposition hardly becomes constant and thus the quality of the film such as crystallinity is less likely to be enhanced.

In addition, even in a case where the substrate-holding part 25 does not have the conductive enclosure part 25c, that is, a conductive property, plasma or electrons are still easily affected by ground potential (zero potential), and are still less likely to stably encaged between the target TG and the substrate SB.

On the other hand, in this embodiment, the insulating member 51 is interposed between the conductive member 41 and the substrate-holding part 25. In such a case and in a case where the substrate-holding part 25 has the conductive enclosure part 25c, that is, a conductive property, the conductive enclosure part 25c, that is, the substrate-holding part 25 is put into an electrically floating state. Accordingly, when plasma is generated inside the chamber 21 to perform sputtering of the target TG, plasma or electrons are less likely to be affected by the ground potential (zero potential), and are easily encaged stably between the target TG and the substrate SB. Accordingly, for example, in a case where a piezoelectric film such as lead zirconate titanate is to be formed, distribution of charges in the piezoelectric film under deposition easily becomes constant and thus the quality of the film such as crystallinity is easily enhanced.

Furthermore, even in a case where the substrate-holding part 25 does not have the conductive enclosure part 25c, that is, a conductive property, and as compared with a case where the insulating member 51 is not interposed between the conductive member 41 and the substrate-holding part 25, plasma or electrons are less likely to be affected by the ground potential (zero potential), and are easily encaged stably between the target TG and the substrate SB.

Note that, "a member has a conductive property" means a case where electrical resistivity of the member is, for example, not more than $10^{-6}$ Ωm. On the other hand, "a member has an insulating property" means a case where electrical resistivity of the member is, for example, not less than $10^8$ Ωm.

As aforementioned, the insulating member 51 is interposed between the chamber 21 and the conductive member 42, and the conductive member 42 electrically floats.

There is assumed a case where the insulating member 51 is not interposed between the chamber 21 and the conductive member 42, and the chamber 21 is in electrical contact with the conductive member 42. In such a case and in a case where the substrate-holding part 25 has the conductive enclosure part 25c, that is, a conductive property, the conductive enclosure part 25c, that is, the substrate-holding part 25 is put into a grounded state, and the electric potential of the conductive enclosure part 25c, that is, the substrate-holding part 25 becomes zero potential. Accordingly, when plasma is generated inside the chamber 21 to perform sputtering of a target, plasma or electrons are easily affected by the ground potential (zero potential), and are less likely to be stably encaged between the target TG and the substrate SB.

Moreover, even in a case where the substrate-holding part 25 does not have the conductive enclosure part 25c, that is, a conductive property, plasma or electrons are still easily affected by zero potential, and are still less likely to be stably encaged between the target TG and the substrate SB.

On the other hand, in this embodiment, the insulating member 51 is interposed between the chamber 21 and the conductive member 42, and the conductive member 42 electrically floats. In such a case and in a case where the substrate-holding part 25 has the conductive enclosure part 25c, that is, a conductive property, the conductive enclosure part 25c, that is, the substrate-holding part 25 is put into an electrically floating state. Accordingly, when plasma is generated in the chamber 21 to perform sputtering of the target TG, plasma or electrons are less likely to be affected by the ground potential (zero potential), and are easily encaged stably between the target TG and the substrate SB. Therefore, for example, in a case where a piezoelectric film such as lead zirconate titanate is to be formed, distribution of charges in the piezoelectric film during deposition easily becomes constant and thus the quality of the film such as crystallinity is easily enhanced.

In addition, even in a case where the substrate-holding part 25 does not have the conductive enclosure part 25c, that is, a conductive property, and as compared with the case where the insulating member 51 is not interposed between the chamber 21 and the conductive member 42, plasma or electrons are less likely to be affected by the ground potential (zero potential), and are easily encaged stably between the target TG and the substrate SB.

Note that, in addition to the insulating member 51, for example, an insulating member 53 may be interposed between an upper end part of the shaft part 41b and the shaft part 42b, between a lower end part of the shaft part 41b and a lower end part of the shaft part 42b, and between the lower surface of the connection part 41c and the upper surface of the connection part 42c. As the insulating member 53, there can be used an insulating member made of, for example, a PEEK (Poly Ether Ether Ketone) resin or alumina.

Furthermore, a slip ring 44 that encloses the shaft part 42b of the conductive member 42 may be provided. The inner peripheral surface of the slip ring 44 makes contact with the outer peripheral surface of the shaft part 42b. In such a case, since the electric potential of the shaft part 42b can be controlled as desired via the slip ring 44, the electric potential of the conductive member 42 can also be controlled so as to be equal to a constant electric potential.

As shown in FIGS. 7 and 8, the support part 26 may include a conductive member 45 that supports the substrate-holding part 25. The conductive member 45 includes a base part 45a having a cylindrical shape, and a shaft part 45b that has a cylindrical shape, that is provided rotatably integrally with the base part 45a and that has the diameter smaller than the diameter of the base part 45a. Moreover, the conductive member 45 includes a connection part 45c that has an annular shape and connects the base part 45a with the shaft part 45b. The base part 45a, the shaft part 45b and the connection part 45c are integrally formed, and the base part 45a, the shaft part 45b and the connection part 45c are made of metal such as stainless steel.

In the example shown in FIGS. 7 and 8, the base part 45a is provided concentrically with the base part 42a and the base part 41a so that the outer peripheral surface of the base part 45a faces the inner peripheral surface of the base part 42a. The shaft part 45b is provided concentrically with the shaft part 42b and the shaft part 41b so that the outer peripheral surface of the shaft part 45b faces the inner peripheral surface of the shaft part 42b. The connection part 45c is fixed to the connection part 42c and the connection part 41c with the insulating member 51, and accordingly, the conductive member 45 is rotatably provided integrally with the conductive member 42 and the conductive member 41.

In addition, as aforementioned, as a consequence of the fact that the conductive member 42 is fixed to the substrate-holding part 25 through the use of, for example, the screw 43 composed of a conductive member, the conductive member 45 supports the substrate-holding part 25 via the insulating member 51, the conductive member 42 and the screw 43. At this time, the insulating member 51 is interposed between the conductive member 45 and the substrate-holding part 25.

Furthermore, as aforementioned, the insulating member 52 is provided around the screw 43 composed of a conductive member. At this time, since the insulating member 52 is arranged between the conductive member 45 and the substrate-holding part 25, it can also be said that the insulating member 52 is interposed between the conductive member 45 and the substrate-holding part 25.

Note that an insulating member 54 may be interposed between the upper end part of the shaft part 42b and the shaft part 45b, between the lower end part of the shaft part 42b and the lower end part of the shaft part 45b, and between the lower surface of the connection part 42c and the upper surface of the connection part 45c. As the insulating member 54, there can be used an insulating member made of, for example, a PEEK resin or alumina.

The substrate-heating part 28 heats the substrate SB. The substrate-heating part 28 is arranged facing the upper surface of the substrate SB held with the substrate-holding part 25, and is rotatably provided integrally with the support part 26. As the substrate-heating part 28, there can be used a lamp unit equipped with, for example, an infrared lamp.

The deposition-preventive plate 29 is composed of a conductive member attached to the chamber 21. The deposition-preventive plate 29 is a plate that prevents a deposition material from adhering to a part inside the chamber 21 to which the deposition material is not desired to adhere, in a case where the film deposition apparatus 20 deposits a film by performing sputtering of the surface of the target TG and thereby causing the deposition material to adhere to the surface of the substrate SB. In this embodiment, the deposition-preventive plate 29 prevents the deposition material from adhering to a part arranged around the substrate SB, in plan view, held with the substrate-holding part 25. In the example shown in FIG. 7, the deposition-preventive plate 29 prevents the deposition material from adhering to the substrate-holding part 25. As a conductive member constituting the deposition-preventive plate 29, there can be used a conductive member made of stainless steel. Accordingly, for example, temperature of the deposition-preventive plate 29 can easily be adjusted with, for example, a cooling tube through which cooling water passes, and thus influence of the deposition-preventive plate 29 on the temperature of the substrate SB held with the substrate-holding part 25 can be reduced.

Moreover, an insulating member 55 is interposed between the chamber 21 and the deposition-preventive plate 29, and the deposition-preventive plate 29 electrically floats. Note that a conductive member 46 is interposed between the chamber 21 and the insulating member 55, a conductive member 47 is interposed between the insulating member 55 and the deposition-preventive plate 29, and the conductive member 46 and the conductive member 47 may be fastened using a screw 56 composed of an insulating member in a state of interposing the insulating member 55.

There is assumed a case where the insulating member 55 is not interposed between the chamber 21 and the deposition-preventive plate 29, and the chamber 21 is in electrical contact with the deposition-preventive plate 29. In such a case, the deposition-preventive plate 29 is put into a grounded state, and the electric potential of the deposition-preventive plate 29 becomes zero potential. Accordingly, when plasma is generated in the chamber 21 to perform sputtering of the target TG, plasma or electrons are easily affected by the ground potential (zero potential), and are less likely to be stably encaged between the target TG and the substrate SB. Therefore, in a case where a piezoelectric film such as lead zirconate titanate is to be formed, distribution of charges in the piezoelectric film during deposition is less likely to become constant and thus the quality of the film such as crystallinity is hardly enhanced.

On the other hand, in this embodiment, the insulating member 55 is interposed between the chamber 21 and the deposition-preventive plate 29. In such a case, the deposition-preventive plate 29 is put into an electrically floating state. Accordingly, when plasma is generated in the chamber 21 to perform sputtering of the target TG, plasma or electrons are less likely to be affected by the ground potential (zero potential), and are easily encaged stably between the target TG and the substrate SB. Therefore, in a case where a piezoelectric film such as lead zirconate titanate is to be formed, distribution of charges in the piezoelectric film during deposition easily becomes constant and thus the quality of the film such as crystallinity is easily enhanced.

As described above, the film deposition apparatus 20 of this embodiment is constituted so that plasma or electrons are encaged stably between the target TG and the substrate SB, as consequence of the fact that the conductive member is put into an electrically floating state even in a case where a conductive member is not arranged near the substrate SB, or a conductive member is arranged near the substrate SB. Accordingly, the present inventors have found out for the first time that, for example, in a case where a piezoelectric film such as lead zirconate titanate is to be formed, distribution of charges in the piezoelectric film during deposition easily becomes constant, and thus the quality of the film such as crystallinity is enhanced and the ferroelectric property and piezoelectric property of the formed piezoelectric film are excellent. Therefore, in a film deposition apparatus for depositing a piezoelectric film containing lead zirconate titanate, a piezoelectric film, whose quality such as crystallinity is good, can be deposited.

The target-holding part 31 holds the target TG inside the chamber 21. In addition, the target TG includes a backing plate BP1, and a target material TM1 fixed to one side of the backing plate BP1. The surface of the target TG held with the target-holding part 31 faces the surface of the substrate SB. In the example shown in FIG. 7, the target-holding part 31 is provided on the lower side of the substrate-holding part 25, and the upper surface of the target TG held with the target-holding part 31 faces the lower surface of the substrate SB held with the substrate-holding part 25.

The power supply part 32 supplies high-frequency power to the target TG. As a consequence of supplying high-frequency power to the target TG by the power supply part 32, the target TG is subjected to sputtering. Namely, the film deposition apparatus 20 of this embodiment is an RF (Radio Frequency) sputtering apparatus.

The power supply part 32 has a high-frequency power source 32a and a matching device 32b. Preferably, the high-frequency power source 32a is a high-frequency power source equipped with a pulse modulation function modulating high-frequency power into a pulse-like shape. The high-frequency power source 32a is connected to the matching device 32b, and the matching device 32b is connected to the backing plate BP1 of the target TG. Note that, in this embodiment, the power supply part 32 supplies high-frequency power to the target TG via the target-holding part 31, but the power supply part 32 may supply directly high-frequency power to the target TG.

Furthermore, the film deposition apparatus may have a $V_{DC}$ control part 33 that controls a voltage $V_{DC}$ being a direct-current component generated in the target TG when high-frequency power is supplied with the power supply part 32, to −200 V to −80 V. The $V_{DC}$ control part 33 has a $V_{DC}$ sensor, and is electrically connected to the power supply part 32.

Preferably, the film deposition apparatus 20 has a magnet part 34 and a magnet rotation drive part 35. The magnet part 34 is rotatably provided around, for example, the rotary shaft RA1. The magnet rotation drive part 35 rotationally drives the magnet part 34 around the rotary shaft RA1, and applies a magnetic field to the target TG with the magnet part 34 that is rotationally driven. Namely, the film deposition apparatus of this embodiment is an RF magnetron sputtering apparatus. Moreover, the magnet part 34 or the magnet rotation drive part 35 is a magnetic field application part that applies a magnetic field to the target TG.

Preferably, magnetic flux density on the surface of the target TG to which a magnetic field is applied (in the example shown in FIG. 8, the upper surface) is 140 to 180 G. In a case where the magnetic flux density on the surface of the target TG is not less than 140 G, plasma or electrons are stably encaged near the surface of the target TG, as compared with a case where a magnetic flux density on the surface of the target TG is less than 140 G. On the other hand, in a case where the magnetic flux density on the surface of the target TG is not more than 180 G, plasma or electrons are encaged without too much concentration on the surface of the target TG and in an appropriate density, as compared with a case where magnetic flux density on the surface of the target TG exceeds 180 G. Note that the magnetic field on the surface of the target TG preferably is along the surface of the target TG.

<Method for Manufacturing Film Structure Body>

Next, a method of manufacturing the film structure body of this embodiment will be described. FIGS. 10 to 13 are cross-sectional views of the film structure body of the embodiment in a manufacturing process.

Figure 11:
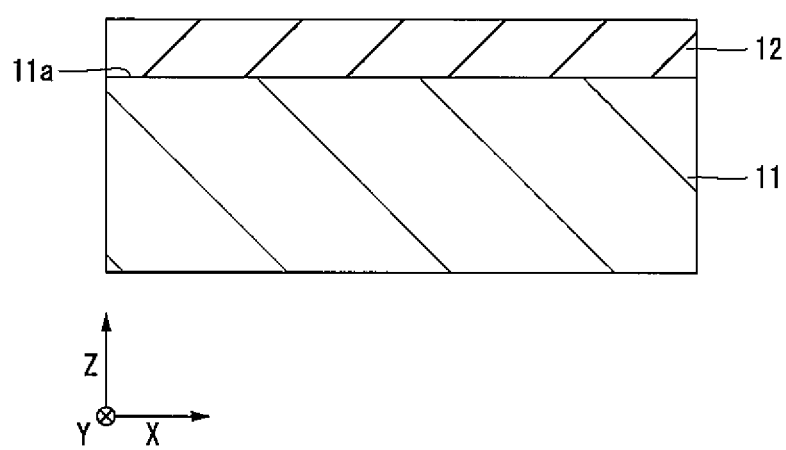
FIG. 11 is a cross-sectional view of the film structure body of the embodiment in a manufacturing process.

First, the substrate 10 is prepared as shown in FIG. 11 (Step S1). In Step S1, the substrate 11 that is a silicon substrate made of, for example, a silicon (Si) single crystal is prepared. The substrate 11 made of the silicon single crystal has a cubic crystal structure and has the upper surface 11a as a principal surface composed of the (100) plane. When the substrate 11 is a silicon substrate, an oxide film such as a $SiO_2$ film may be formed on the upper surface 11a of the substrate 11.

Note that various substrates other than the silicon substrate can be used as the substrate 11, and there can be used, for example, an SOI (Silicon on Insulator) substrate, a substrate made of various semiconductor single crystals other than silicon, a substrate made of various oxide single crystals such as sapphire, a substrate made of a glass substrate in which a polysilicon film is formed on its surface, or the like.

Figure 10:
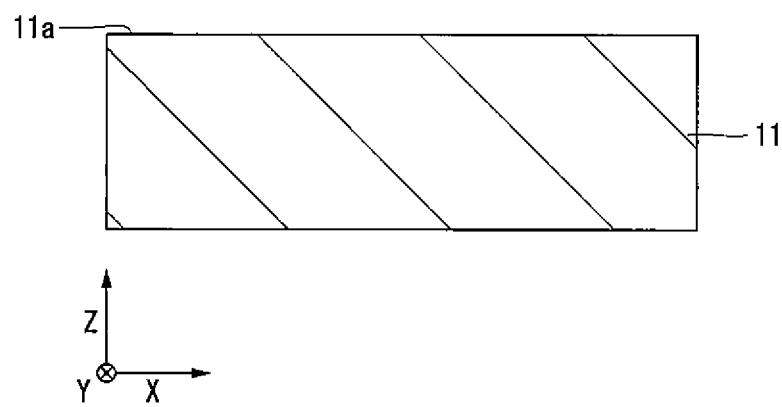
FIG. 10 is a cross-sectional view of the film structure body of the embodiment in a manufacturing process.

As shown in FIG. 10, two directions orthogonal to each other in the upper surface 11a composed of the (100) plane on the substrate 11 made of a silicon single crystal are defined as an X-axis direction and a Y-axis direction, and a direction perpendicular to the upper surface 11a is defined as a Z-axis direction.

Subsequently, the orientation film 12 is formed on the substrate 11 as shown in FIG. 11 (Step S2). Hereinafter, a case where the orientation film 12 is formed using an electron-beam vapor deposition method in Step S2 will be described by way of example, and for example, the orientation film 12 can be formed using various methods such as a sputtering method.

In Step S2, first, the substrate 11 is heated to, for example, 700° C. in a state where the substrate 11 is placed under constant vacuum atmosphere.

In Step S2, subsequently zirconium (Zr) is evaporated by an electron beam vapor deposition method using a vapor deposition material of a Zr single crystal. At this time, the evaporated Zr reacts with oxygen on the substrate 11 heated to, for example, 700° C. to thereby deposit a zirconium oxide ($ZrO_2$) film. Then, the orientation film 12 made of the $ZrO_2$ film as a single layer film is formed.

The orientation film 12 is epitaxially grown on the upper surface 11a as a principal surface composed of the (100) plane of the substrate 11 made of the silicon single crystal. The orientation film 12 has a cubic crystal structure and contains the (100)-oriented zirconium oxide ($ZrO_2$). Namely, the orientation film 12 composed of the single layer film containing the (100)-oriented zirconium oxide ($ZrO_2$) is formed on the upper surface 11a composed of the (100) plane of the substrate 11 made of the silicon single crystal.

As explained using the above-described FIG. 10, two directions orthogonal to each other in the upper surface 11a composed of the (100) plane of the substrate 11 made of the silicon single structure are defined as an X-axis direction and a Y-axis direction, and the direction perpendicular to the upper surface 11a is defined as a Z-axis direction.

It is assumed that the orientation film 12 includes a zirconium oxide film having a cubic crystal structure and being (100)-oriented.

The thickness of the orientation film 12 is preferably 2 to 100 nm, more preferably 10 to 50 nm. The film has such a film thickness, whereby the film is epitaxially grown, and thus the orientation film 12 having a crystal extremely close to a single crystal can be formed.

Next, the conductive film 13 is formed as shown in FIG. 4 (Step S3).

In this Step S3, first, the conductive film 13 as a part of the lower electrode, which has been epitaxially grown on the orientation film 12, is formed. The conductive film 13 is made of a metal. As the conductive film 13 made of a metal, there is used, for example, a conductive film containing platinum (Pt).

When the conductive film containing Pt is formed as the conductive film 13, the conductive film 13 epitaxially grown on the orientation film 12 at a temperature of 450 to 600° C. by a sputtering method is formed as a part of the lower electrode. The conductive film 13 containing Pt is epitaxially grown on the orientation film 12. In addition, Pt contained in the conductive film 13 has a cubic crystal structure and is (100)-oriented.

The conductive film 13 has a cubic crystal structure and includes a (100)-oriented platinum film.

Note that, as the conductive film 13 made of a metal, there can be used, for example, a conductive film containing iridium (Ir) instead of the conductive film containing platinum (Pt).

In this step S3, subsequently, the conductive film 13 is heat-treated at a temperature of 450 to 600° C. Specifically, it is preferable that the conductive film 13 is formed at a temperature of 450 to 600° C. by a sputtering method and is then heat-treated while being maintained at a temperature of 450 to 600° C. for 10 to 30 minutes.

When the conductive film 13 is heat-treated at lower than a temperature of 450° C., the crystallinity of platinum contained in the conductive film 13 cannot be enhanced due to the excessively low temperature, and the crystallinity of the piezoelectric film 15 formed on the conductive film 13 via the film 14 cannot be enhanced. When the conductive film 13 is heat-treated at a temperature exceeding 600° C., crystal grains of platinum contained in the conductive film 13 is grown due to the excessively high temperature, and thus contrarily the crystallinity of platinum cannot be enhanced, and the crystallinity of the piezoelectric film 15 formed on the conductive film 13 via the film 14 cannot be enhanced. On the other hand, when the conductive film 13 is heat-treated at a temperature of 450 to 600° C., the crystallinity of platinum contained in the conductive film 13 can be enhanced, and the crystallinity of the piezoelectric film 15 formed on the conductive film 13 via the film 14 can be enhanced.

In addition, when the conductive film 13 is heat-treated at a temperature of 450 to 600° C., it is preferably heat-treated while being maintained for 10 to 30 minutes. When the period for heat-treating the conductive film 13 is shorter than 10 minutes, the crystallinity of platinum contained in the conductive film 13 cannot be enhanced due to the excessively short period, and the crystallinity of the piezoelectric film 15 formed on the conductive film 13 via the film 14 cannot be enhanced. When the period for heat-treating the conductive film 13 is longer than 30 minutes, the crystal grains of platinum contained in the conductive film 13 are grown due to the excessively long period, and thus contrarily the crystallinity of platinum cannot be enhanced, and the crystallinity of the piezoelectric film 15 formed on the conductive film 13 via the film 14 cannot be enhanced.

Figure 12:
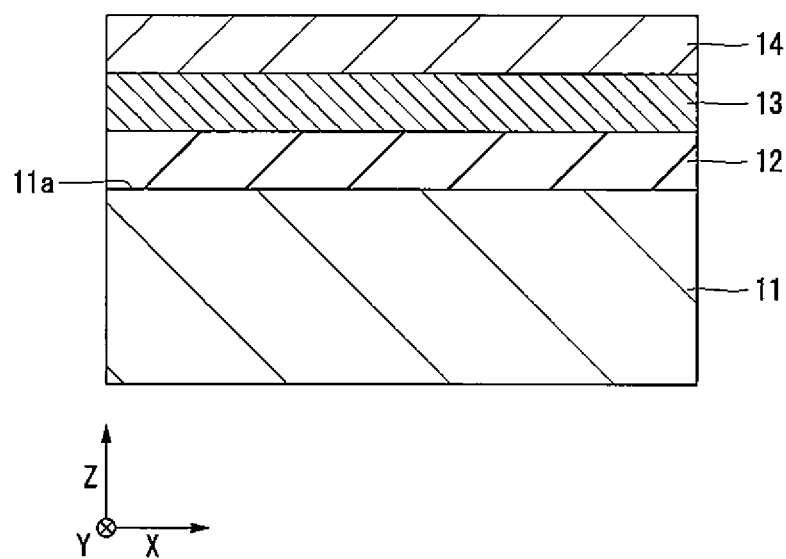
FIG. 12 is a cross-sectional view of the film structure body of the embodiment in a manufacturing process.

Next, the film 14 is formed as shown in FIG. 12 (Step S4). In this Step S4, the film 14 containing a composite oxide represented by the above general formula (Chemical Formula 4) is formed on the conductive film 13. As the composite oxide represented by the above general formula (Chemical Formula 4), a conductive film containing, for example, strontium titanate (STO), strontium ruthenate titanate (STRO) or strontium ruthenate (SRO) can be formed. When a conductive film containing SRO as the complex oxide represented by the above general formula (Chemical Formula 4) is formed, the film 14 as a conductive film as a part of the lower electrode is formed on the conductive film 13 in Step S4. Note that z satisfies 0≤z≤1 in the above general formula (Chemical Formula 4).

When a conductive film containing STO, STRO or SRO is formed as the film 14, the film 14 epitaxially grown on the conductive film 13 at a temperature of approximately 600° C. by a sputtering method is formed as a part of the lower electrode. The film 14 containing STO, STRO or SRO is epitaxially grown on the conductive film 13. In addition, STO, STRO or SRO contained in the film 14 is (100)-oriented in the pseudo-cubic or cubic representation.

The film 14 includes the SRO film having a pseudo-cubic crystal structure and being (100)-oriented.

In addition, the film 14 can be formed by a coating method such as a sol-gel method instead of the sputtering method. In such a case, in Step S4, first, a solution containing strontium and ruthenium, strontium, titanium and ruthenium, or strontium and titanium is coated onto the film 14, whereby a film containing a precursor of the complex oxide represented by the above general formula (Chemical Formula 4) is formed. Furthermore, when the film 14 is formed by the coating method, in Step S4, subsequently the precursor is oxidized and crystallized by heat-treatment of the film, whereby the film 14 containing the composite oxide represented by the above general formula (Chemical Formula 4) is formed.

Figure 13:
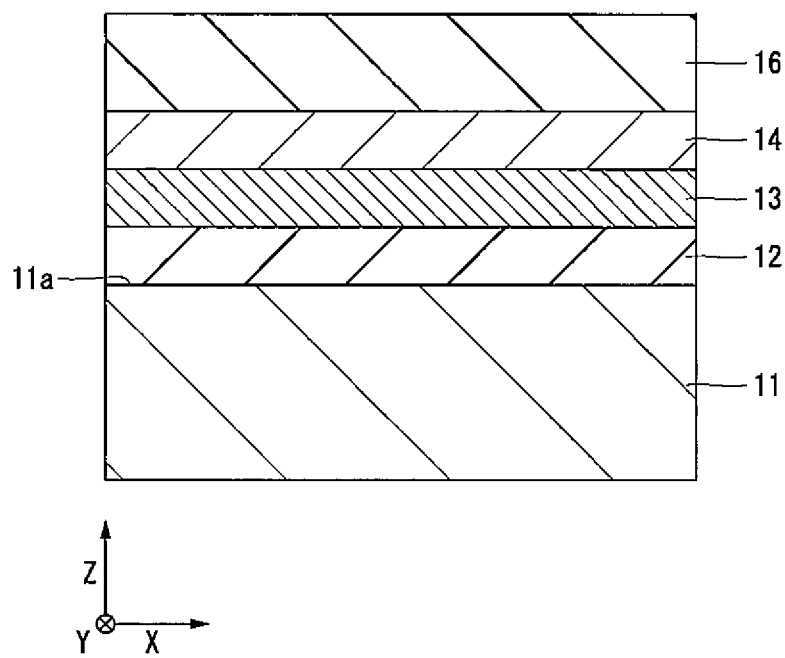
FIG. 13 is a cross-sectional view of the film structure body of the embodiment in a manufacturing process.

Next, the piezoelectric film 16 is formed as shown in FIG. 13 (Step S5). In this Step S5, the piezoelectric film 16 containing a composite oxide represented by the above general formula (Chemical Formula 6) and composed of lead zirconate titanate (PZT) is formed on the film 14 by a sputtering method. Here, in the general formula (Chemical Formula 6), x satisfies $0.32 \leq x \leq 0.52$.

In this range, when x satisfies $0.32 \leq x \leq 0.48$, the PZT contained in the piezoelectric film 16 has primarily a composition of exhibiting a rhombohedral crystal structure, but tends to have a tetragonal crystal structure and to be (001)-oriented mainly due to a binding power from the substrate 11 etc. Then, a piezoelectric film 16 containing the PZT is epitaxially grown on the film 14. In a case where x satisfies $0.48 < x \leq 0.52$, the PZT contained in the piezoelectric film 16 has primarily a composition of exhibiting a tetragonal crystal structure, and thus has a tetragonal crystal structure and is (001)-oriented. Then, the piezoelectric film 16 containing the PZT is epitaxially grown on the film 14. Accordingly, a polarization axis of lead zirconate titanate contained in the piezoelectric film 16 can be oriented approximately perpendicularly to the upper surface 11a, and thus the piezoelectric property of the piezoelectric film 16 can be enhanced.

It is assumed that the piezoelectric film 16 includes a lead zirconate titanate film having a cubic crystal structure and being (001)-oriented.

For example, when the piezoelectric film 16 is formed by the sputtering method, each of plural crystal grains 16g (refer to FIG. 5) contained in the piezoelectric film 16 can be polarized by plasma. Therefore, each of the plural crystal grains 16g contained in the deposited piezoelectric film 16 has spontaneous polarization. The spontaneous polarizations included in each of the plural crystal grains 16g include polarization components P1 parallel to the thickness direction of the piezoelectric film 16 (refer to FIG. 5). In addition, the polarization components P1 included in the spontaneous polarizations of each of plural crystal grains 16g are oriented in the same direction. As a result, the formed piezoelectric film 16 has the spontaneous polarizations as the whole piezoelectric film 16 before polarization.

Namely, in Step S5, when the piezoelectric film 16 is formed by the sputtering method, the piezoelectric film 16 can be polarized by plasma. As a result, in the case where the film structure body 10 of this embodiment is used as a piezoelectric element, it is unnecessary to subject the piezoelectric film 16 to a polarization treatment prior to use, as explained using FIG. 6.

In addition, in Step S5, when the piezoelectric film 16 is formed by the sputtering method, for example, the piezoelectric film 16 is expanded by injecting a sputtered particle and argon (Ar) gas into the piezoelectric film 16, whereby the piezoelectric film 16 has compressive stress.

In Step S5, a film containing PZT as a composite oxide is preferably deposited at a temperature of 425 to 475° C. and at a film deposition rate of 0.29 nm/s or lower, whereby the piezoelectric film 16 made of the deposited film is formed. By such a condition, it is possible to easily obtain a film structure body satisfying the above mathematical formula (Mathematical formula 1) and mathematical formula (Mathematical formula 2).

Alternatively, in Step S5, an underlayer film containing the PZT as a composite oxide is preferably deposited at a temperature of 425 to 475° C. and at a first film deposition rate of 0.29 nm/s or lower. Then, an overlayer film containing PZT as a composite oxide is deposited on the underlayer film at a temperature of 425 to 475° C. and at a second film deposition rate lower than the first film deposition rate, whereby the piezoelectric film 16 composed of the deposited underlayer film and the overlayer film is formed. By such a condition, it is possible to easily obtain a film structure body satisfying the above mathematical formula (Mathematical formula 1) and mathematical formula (Mathematical formula 2).

Hereinafter, there will be explained a film deposition method for depositing the piezoelectric film 16 through the use of the film deposition apparatus 20 explained above using FIGS. 7 to 9.

First, the target TG is held in the chamber 21 by the target-holding part 31

Next, the substrate SB is held in the chamber 21 by the substrate-holding part 25. As the substrate SB, there can be used, for example, a film structure body in which the orientation film 12, the conductive film 13 and the film 14 are formed on the above-described substrate 11. The substrate-holding part 25 is supported with the support part 26 attached to the chamber 21, the insulating member 51 is interposed between the support part 26 and the substrate-holding part 25, or between the chamber 21 and the support part 26. In addition, the substrate-holding part 25 holds the substrate SB in a state where the outer peripheral part of the substrate SB comes into contact with the substrate-holding part 25 and the central part of the substrate SB is separated from the substrate-holding part 25. The support part 26 includes the conductive members 41 and 42. The conductive members 41 and 42 are rotatably provided integrally with the substrate-holding part 25 around the rotation axis RA1. The conductive member 42 is put into an electrically floating state. Accordingly, plasma or electrons are less likely to be affected by the ground potential (zero potential), and are easily encaged stably between the target TG and the substrate SB.

The substrate-holding part 25 includes an insulating enclosure part 25a that is composed of an insulating member and that encloses the substrate SB in plan view, and plural protruding parts 25b each of which is composed of an insulating member and protrudes from the insulating enclosure part 25a toward the center side of the substrate SB in plan view. The substrate-holding part 25 holds the substrate SB in a state where the outer peripheral part (outer edge part) of the lower surface of the substrate SB comes into contact with each upper surface of the plural protruding parts 25b. Accordingly, shift of the actual temperature of the central part of the substrate SB from a targeted temperature can be prevented or suppressed when the substrate SB is to be heated with the substrate-heating part 28.

Next, the substrate SB is heated by the substrate-heating part 28, the conductive members 41 and 42 are rotationally driven by the rotation-driving unit 27, and in a state where a magnetic field is applied to the target TG by the magnet part 34 and a high-frequency power is supplied to the target TG by the power supply part 32, the surface of the target TG is subjected to sputtering in the chamber 21, whereby the piezoelectric film 16 is deposited on the surface of the substrate SB.

The film deposition apparatus 20 is an apparatus that causes the film deposition material to adhere to the surface of the substrate SB by performing sputtering of the surface of the target TG, to thereby deposit the piezoelectric film 16, and at this time, a deposition-preventive plate 29 that is attached to the chamber 21 and is composed of the conductive member prevents the deposition material from adhering to the substrate-holding part 25. The insulating member 55 is interposed between the deposition-preventive plate 29 and the chamber 21, and the deposition-preventive plate 29 electrically floats. Accordingly, plasma or electrons are less likely to be affected by a ground potential (zero potential) and they are easily encaged stably between the target TG and the substrate SB.

Next, the piezoelectric film 17 is formed as shown in FIG. 1 (Step S6). In this Step S6, the piezoelectric film 17 containing a composite oxide represented by the above general formula (Chemical Formula 7) and made of lead zirconate titanate (PZT) is formed on the piezoelectric film 16 by a coating method such as a sol-gel method. Hereinafter, a method for forming the piezoelectric film 17 by the sol-gel method will be explained.

In Step S6, first, a solution containing lead, zirconium and titanium is coated onto the piezoelectric film 16, whereby a film containing a precursor of PZT is formed. Note that the step of coating a solution containing lead, zirconium and titanium may be repeated multiple times, and thus a film including a plurality of films laminated to each other is formed.

In step S6, subsequently, the precursor is oxidized and crystallized by heat-treating the film, whereby the piezoelectric film 17 containing PZT is formed. Here, in the general formula (Chemical Formula 7), y satisfies $0.32 \leq y \leq 0.48$.

In this range, when y satisfies $0.32 \leq y \leq 0.48$, the PZT contained in the piezoelectric film 17 has primarily a composition of exhibiting a rhombohedral crystal structure, but tends to have a tetragonal crystal structure and to be (001)-oriented mainly due to a binding power from the substrate 11 etc. Then, a piezoelectric film 17 containing the PZT is epitaxially grown on the piezoelectric film 16. Note that, in a case where y satisfies $0.48 < y \leq 0.52$, the PZT contained in the piezoelectric film 17 has primarily a composition of exhibiting a tetragonal crystal structure, and thus has a tetragonal crystal structure and is (001)-oriented. Then, the piezoelectric film 17 containing the PZT is epitaxially grown on the piezoelectric film 16. Accordingly, a polarization axis of lead zirconate titanate contained in the piezoelectric film 17 can be oriented approximately perpendicularly to the upper surface 11a, and thus the piezoelectric property of the piezoelectric film 17 can be enhanced.

It is assumed that the piezoelectric film 17 includes a lead zirconate titanate film having a cubic crystal structure and being (100)-oriented.

In a case where PZT having the tetragonal crystal structure is (001)-oriented, the polarization direction parallel to the [001] direction and the electric field direction parallel to the thickness direction of the piezoelectric film 15 are parallel to each other, and thus the piezoelectric property is enhanced. Namely, in PZT having a tetragonal crystal structure, in a case where an electric field along the [001] direction is applied, piezoelectric constants $d_{33}$ and $d_{31}$ each having a large absolute value are obtained. Accordingly, the piezoelectric constant of the piezoelectric film 15 can be further increased. Note that, in the specification of the present application, the sign of the piezoelectric constant $d_{31}$ is originally negative, but in some cases, the sign is omitted and it is expressed as an absolute value.

In Step S6, for example, the piezoelectric film 17 receives a tensile stress by evaporation of a solvent in a solution during heat treatment or by contraction of the film during oxidization and crystallization of the precursor.

In this manner, the piezoelectric film 15 including the piezoelectric film 16 and the piezoelectric film 17 is formed, and the film structure body 10 shown in FIG. 1 is formed. Namely, Step S5 and Step S6 are included in the process of forming the lead zirconate titanate-containing piezoelectric film 15 that is (001)-oriented in the tetragonal representation or (100)-oriented in the pseudo-cubic crystal representation on the conductive film 13 via the film 14 and that is epitaxially grown.

Next, the diffraction pattern of the piezoelectric film 15 is measured by X-ray diffraction measurement using the θ-2θ method (Step S7).

In a case where the piezoelectric film 15 has a tetragonal crystal structure and contains the (001)-oriented PZT, in this embodiment, in an X-ray diffraction pattern of the piezoelectric film 15 by the θ-2θ method using a CuKα ray, when a diffraction angle of a diffraction peak of a (004) plane in the tetragonal representation of lead zirconate titanate is denoted as $2\theta_{004}$, $2\theta_{004}$ satisfies the following formula (Mathematical Formula 1).

$$2\theta_{004} \leq 96.5° \quad \text{(Mathematical Formula 1)}$$

Accordingly, a space between (004) planes in the tetragonal representation of lead zirconate titanate becomes long. Alternatively, a content percentage of lead zirconate titanate having a tetragonal crystal structure and being (001)-oriented (c-axis-oriented) in the piezoelectric film 15 can be made larger than a content percentage of lead zirconate titanate having a tetragonal crystal structure and being (100)-oriented (a-axis-oriented) in the piezoelectric film 15. Therefore, a polarization direction of each of plural crystal grains included in the piezoelectric film 15 can be made uniform, and thus a piezoelectric property of the piezoelectric film 15 can be enhanced.

On the other hand, in a case where the piezoelectric film 15 contains PZT that is (100)-oriented in the pseudo-cubic crystal representation, in this embodiment, when a diffraction angle of a diffraction peak of a (400) plane in the pseudo-cubic crystal representation of lead zirconate titanate is denoted as $2\theta_{400}$ in an X-ray diffraction pattern of the piezoelectric film 15 by the θ-2θ method using a CuKα ray, $2\theta_{400}$ satisfies a formula ($2\theta_{400} \leq 96.5°$) obtained by substituting $2\theta_{004}$ by $2\theta_{400}$ in the above-described formula (Mathematical Formula 1).

In addition, in this embodiment, in a case where relative permittivity of the piezoelectric film 15 is denoted as $\varepsilon_r$, $\varepsilon_r$ satisfies the following formula (Mathematical Formula 2).

$$\varepsilon_r \leq 450 \quad \text{(Mathematical Formula 2)}$$

Accordingly, in a case where the film structure body 10 is used as, for example, a pressure sensor utilizing a piezoelectric effect, the detection sensitivity can be enhanced, and the detection circuit of the pressure sensor can easily be designed. Alternatively, in a case where the film structure body 10 is used as, for example, an ultrasonic oscillator utilizing an inverse piezoelectric effect, the oscillation circuit can easily be designed.

Note that, after formation of the piezoelectric film 17, the conductive film 18 (refer to FIG. 2) as an upper electrode may be formed on the piezoelectric film 17 (Step S8). Accordingly, an electric field can be applied to the piezoelectric film 17 in the thickness direction.

In addition, after formation of the piezoelectric film 18, the relative permittivity may be measured by applying an alternating voltage having a frequency of 1 kHz between the conductive film 13 and the conductive film 18 (Step S9).

Preferably, in a case where the film structure body 10 has the conductive film 18, when relative permittivity of the piezoelectric film 15 to be measured by applying an alternating voltage having a frequency of 1 kHz between the conductive film 13 and the conductive film 18 is denoted as $\varepsilon_r$, $\varepsilon_r$ of the piezoelectric film 15 satisfies the above-described formula (Mathematical Formula 2).

As a consequence of the fact that the relative permittivity on the basis of an alternating voltage having such frequency becomes small, for example, it is possible to enhance a clock frequency of a detection circuit and to enhance response speed of a pressure sensor using the film structure body 10.

Preferably, when a residual polarization value of the piezoelectric film 15 is denoted as $P_r$, $P_r$ satisfies the following formula (Mathematical Formula 3).

$P_r \geq 28 \mu C/cm^2$  (Mathematical Formula 3)

Accordingly, the ferroelectric property of the piezoelectric film 15 can be enhanced, and thus the piezoelectric property of the piezoelectric film 15 can also be enhanced.

Note that a film containing the lead zirconate titanate may be formed between the film 14 and the piezoelectric film 15. The film may contain a composite oxide represented by the above general formula (Formula 8) and (100)-oriented in the pseudo-cubic crystal representation.

MODIFIED EXAMPLE OF THE EMBODIMENT

In the embodiment, the piezoelectric film 15 including the piezoelectric film 16 and the piezoelectric film 17 was formed as shown in FIG. 1. However, the piezoelectric film 15 may include only the piezoelectric film 16. Such an example will be explained as a modified example of the embodiment.

Figure 14:
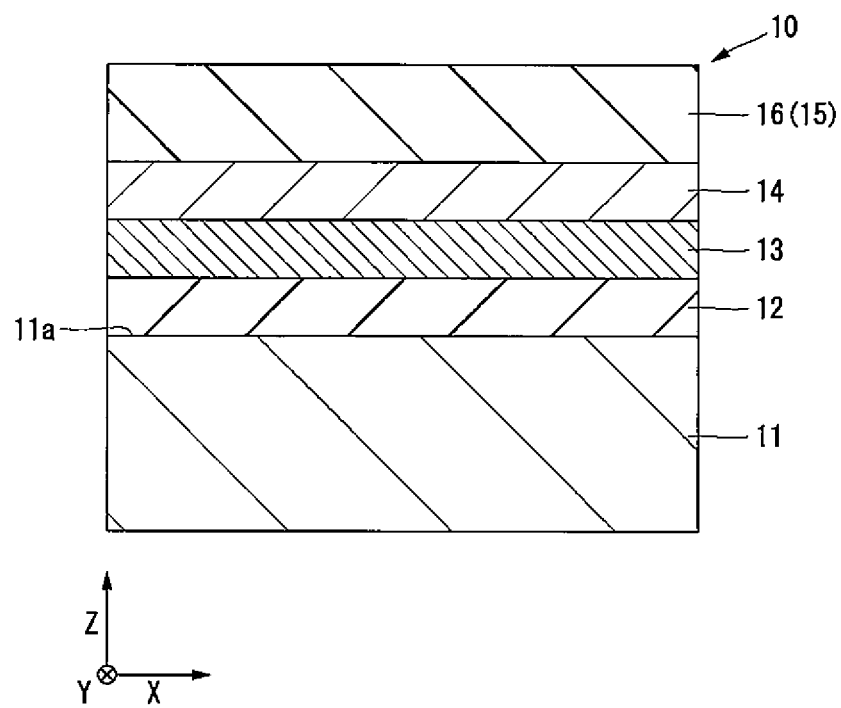
FIG. 14 is a cross-sectional view in a modified example of a film structure body of the embodiment.

FIG. 14 is a cross-sectional view in a modified example of a film structure body of the embodiment.

As shown in FIG. 14, the film structure body 10 of this modified example has the substrate 11, the orientation film 12, the conductive film 13, the film 14 and the piezoelectric film 15. The orientation film 12 is formed on the substrate 11. The conductive film 13 is formed on the orientation film 12. The film 14 is formed on the conductive film 13. The piezoelectric film 15 is formed on the film 14. The piezoelectric film 15 includes the piezoelectric film 16.

Namely, the film structure body 10 of this modified example is the same as the film structure body 10 of the embodiment except that the piezoelectric film 15 does not include the piezoelectric film 17 (refer to FIG. 1) but includes only the piezoelectric film 16.

In a case where the piezoelectric film 15 includes the piezoelectric film 16 having compression stress but does not include the piezoelectric film 17 having tensile stress (refer to FIG. 1), as compared with a case where the piezoelectric film 15 includes both of the piezoelectric film 16 having compression stress and the piezoelectric film 17 having tensile stress (refer to FIG. 1), an amount of warpage when the film structure body 10 warps increases. However, for example, when the thickness of the piezoelectric film 15 is thin, an amount of warpage when the film structure body 10 warps can be reduced. Accordingly, also in a case where the piezoelectric film 15 includes only the piezoelectric film 16, for example, it is possible to enhance shape accuracy when the film structure body 10 is processed using a photolithographic technology, and to enhance properties of a piezoelectric element to be formed by processing the film structure body 10.

Note that the film structure body 10 of this modified example may also have the conductive film 18 (refer to FIG. 2) similarly to the film structure body 10 of the embodiment.

EXAMPLES

Hereinafter, the embodiments of present invention will be explained in more detail on the basis of Examples. Note that the present invention is not limited by the following Examples.

Example 1 and Comparative Example 1

Hereinafter, the film structure body 10 explained using FIG. 1 in the embodiment was formed as the film structure body of Example 1. For the film structure body of Example 1, in an X-ray diffraction pattern of the piezoelectric film 15 by the θ-2θ method using a CuKα ray, when a diffraction angle of a diffraction peak of a (004) plane in the tetragonal representation of lead zirconate titanate is denoted as $2\theta_{004}$, $2\theta_{004}$ satisfies the following formula (Mathematical Formula 1). Additionally, in the film structure body of Example 1, when relative permittivity of the piezoelectric film 15 is denoted as $\varepsilon_r$, $\varepsilon_r$ satisfies the above formula (Mathematical Formula 2). On the other hand, a film structure body in which $2\theta_{004}$ does not satisfy the above mathematical formula (Mathematical formula 1) was used as the film structure body of Comparative Example 1.

Hereinafter, the method for forming the film structure body of Example 1 will be explained. Note that the method for forming the film structure body in Comparative Example 1 is different from the condition in Example 1 in which the supplied high frequency power (power) is 2250 W, in that the supplied high frequency power (power) is 2750 W in forming the piezoelectric film 16 through the use of an RF sputtering apparatus.

First, as shown in FIG. 10, a wafer that has the upper surface 11a as the principal surface composed of the (100) plane and that is made of a 6-inch silicon single crystal was prepared as the substrate 11.

Next, as shown in FIG. 11, a zirconium oxide ($ZrO_2$) film was formed as the orientation film 12 on the substrate 11 by an electron-beam vapor deposition method. The conditions in this case are shown below.

Apparatus: Electron-beam vapor deposition apparatus
Pressure: $7.00 \times 10^{-3}$ Pa
Deposition source: $Zr+O_2$
Acceleration voltage/emission current: 7.5 kV/1.80 mA
Thickness: 24 nm
Film deposition rate: 0.005 nm/s
Oxygen flow rate: 7 sccm
Substrate temperature: 500° C.

Subsequently, as shown in FIG. 4, a platinum (Pt) film was formed as the conductive film 13 on the orientation film 12 by a sputtering method. The conditions in this case are shown below.

Apparatus: DC sputtering apparatus
Pressure: $1.20 \times 10^{-1}$ Pa
Deposition source: Pt Electric power: 100 W
Thickness: 150 nm
Film deposition rate: 0.14 nm/s
Ar flow rate: 16 sccm
Substrate temperature: 450 to 600° C.

Then, the Pt film was heat-treated. The conditions in this case are shown below.
Apparatus: DC sputtering apparatus
Substrate temperature (heat treatment temperature): 450 to 600° C.
Heat treatment period: 10 to 30 minutes Next, as shown in FIG. 12, an SRO film was formed as the film 14 on the conductive film 13 by a sputtering method. The conditions in this case are shown below.
Apparatus: RF magnetron sputtering apparatus
Power: 300 W
Gas: Ar
Pressure: 1.8 Pa
Substrate temperature: 600° C.
Film deposition rate: 0.11 nm/s
Thickness: 20 nm Subsequently, as shown in FIG. 13, a $Pb(Zr_{0.58}Ti_{0.42})O_3$ film (PZT film) having a thickness of 1 μm was formed as the piezoelectric film 16 on the film 14 by a sputtering method. The conditions in this case are shown below.
Apparatus: RF magnetron sputtering apparatus
Power: 2250 W
Gas: $Ar/O_2$
Pressure: 0.6 Pa
Substrate temperature: 425° C.
Film deposition rate: 0.29 nm/s
Ar flow rate: 66 sccm
Oxygen flow rate: 6 sccm
Film deposition period: 4200 s Then, as shown in FIG. 1, a $Pb(Zr_{0.58}Ti_{0.42})O_3$ film (PZT film) was formed as the piezoelectric film 17 on the piezoelectric film 16 by a coating method. The conditions in this case are shown below.

A raw material solution was prepared, in which organic metal compounds of Pb, Zr and Ti were mixed so as to have a composition ratio of Pb:Zr:Ti=100+δ:58:42, and then, the mixture was dissolved in a mixed solvent of ethanol and 2-n-butoxyethanol so that the concentration of the $Pb(Zr_{0.58}Ti_{0.42})O_3$ was 0.35 mol/l. δ was set to δ=20. Furthermore, 20 g of polypyrrolidone having a K value of 27 to 33 was dissolved in the raw material solution.

Next, 3 ml of the prepared raw material solution was dropped onto the substrate 11 composed of a 6-inch wafer, and the raw material solution was coated on the substrate 11 while the substrate was being rotated at 3000 rpm for 10 seconds, whereby a film containing the precursor was formed. Then, the substrate 11 was placed on a hot plate at a temperature of 200° C. for 30 seconds, and furthermore the substrate 11 was placed on the hot plate at 450° C. for 30 seconds, whereby the film was dried by evaporation of the solvent. Subsequently, the precursor was heat-treated under an oxygen ($O_2$) atmosphere of 0.2 MPa at 600 to 700° C. for 60 seconds to be oxidized and crystallized, and thus the piezoelectric film 17 having a thickness of 30 nm was formed.

As to each of Example 1 and Comparative Example 1, the θ-2θ spectrum by an XRD method of the film structure body in which the films up to the PZT film as the piezoelectric film 17 had been formed was measured. Namely, as to each of Example 1 and Comparative Example 1, X-ray diffraction measurement by the θ-2θ method was carried out.

Figure 15:
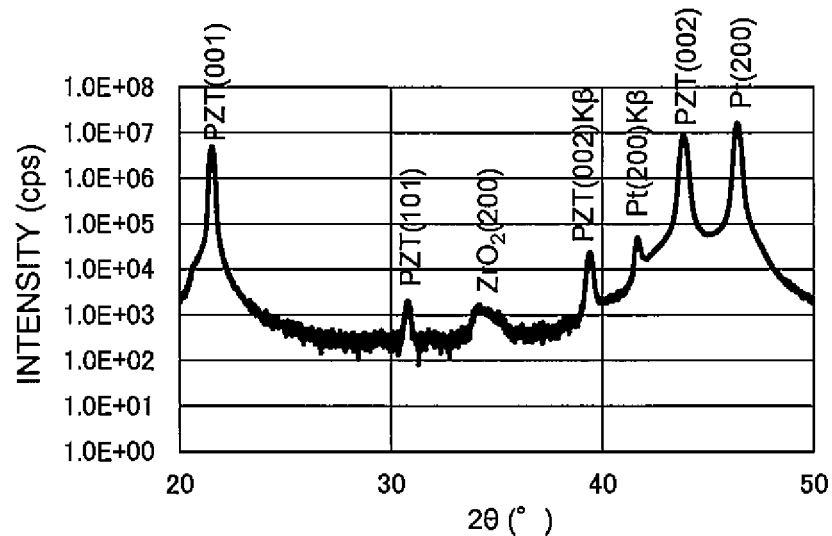
FIG. 15 is a graph showing an example of a θ-2θ spectrum of the film structure body in Example 1 by an XRD method.
Figure 16:
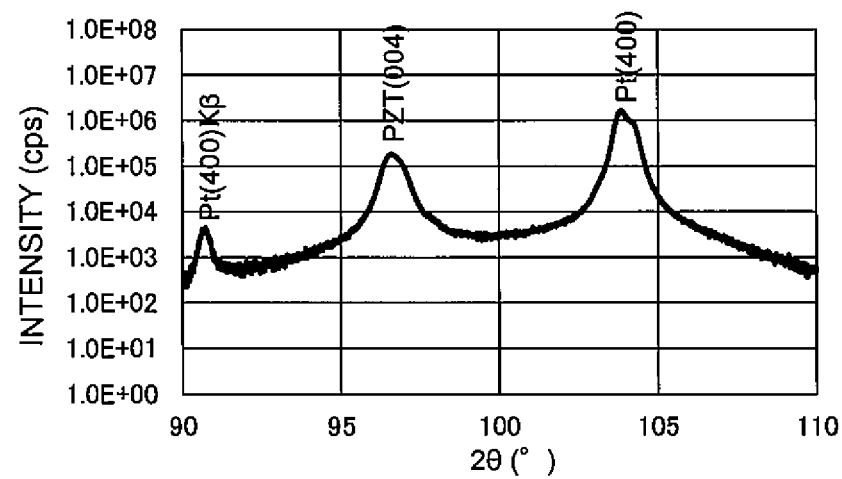
FIG. 16 is a graph showing an example of a θ-2θ spectrum of the film structure body in Example 1 by an XRD method.
Figure 17:
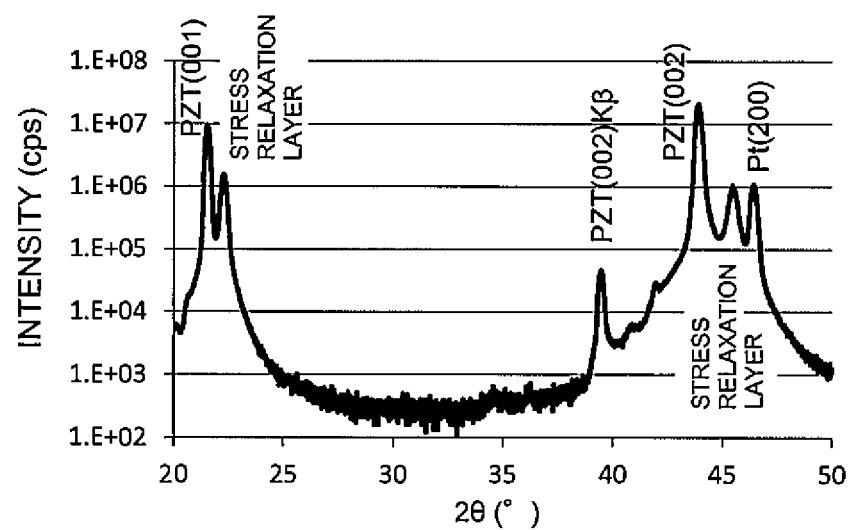
FIG. 17 is a graph showing an example of a θ-2θ spectrum of the film structure body in Comparative Example 1 by an XRD method.
Figure 18:
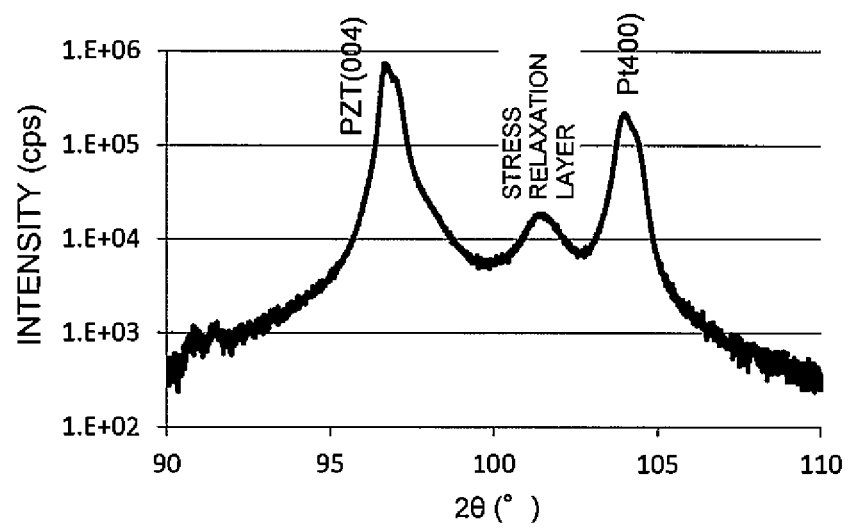
FIG. 18 is a graph showing an example of a θ-2θ spectrum of the film structure body in Comparative Example 1 by an XRD method.

Each of FIGS. 15 to 18 is a graph showing an example of the θ-2θ spectrum by the XRD method of the film structure body in which the films up to the PZT film have been formed. The abscissa in each graph of FIGS. 15 to 18 represents an angle 2θ, and the ordinate of each graph of FIGS. 15 to 18 represents an intensity of X-ray. FIGS. 15 and 16 show the results for Example 1, and FIGS. 17 and 18 show the results for Comparative Example 1. FIGS. 15 and 17 show ranges of 20°≤2θ≤50°, and FIGS. 16 and 18 show ranges of 90°≤2θ≤110°.

In the example shown in FIGS. 15 and 16 (Example 1), peaks corresponding to the (200) plane and (400) plane of Pt having a cubic crystal structure, and peaks corresponding to the (001) plane, (002) plane and (004) plane of PZT in the tetragonal representation were observed in the θ-2θ spectrum. Accordingly, in the example shown in FIGS. 15 and 16 (Example 1), it was found that the conductive film 13 contained Pt having a cubic crystal structure and being (100)-oriented, and the piezoelectric film 15 contained (001)-oriented PZT in the tetragonal representation.

In the example shown in FIG. 16 (Example 1), when the diffraction angle of the diffraction peak on the (004) plane of PZT on the basis of tetragonal representation was $2\theta_{004}$, $2\theta_{004}=96.5°$ was established. Accordingly, in the examples shown in FIGS. 15 and 16 (Example 1), it was found the $2\theta_{004}$ satisfied $2\theta_{004} \leq 96.5°$, and thus satisfied the above mathematical formula (Mathematical formula 1).

Also in the examples shown in FIGS. 17 and 18 (Comparative Example 1), peaks corresponding to the (200) plane and (400) plane of Pt having a cubic crystal structure, and peaks corresponding to the (001) plane, (002) plane and (004) plane of PZT in the tetragonal representation were observed in the θ-2θ spectrum, in the same manner as in the examples shown in FIGS. 15 and 16 (Example 1). Accordingly, also in the examples shown in FIGS. 17 and 18 (Comparative Example 1), it was found that the conductive film 13 contained Pt having a cubic crystal structure and being (100)-oriented, and the piezoelectric film 15 contained (001)-oriented PZT in the tetragonal representation, in the same manner as in the examples shown in FIGS. 15 and 16 (Example 1).

However, in the example shown in FIG. 18 (Comparative Example), when the diffraction angle of the diffraction peak on the (004) plane in the tetragonal representation of PZT was $2\theta_{004}$, $2\theta_{004}=96.7°$ was established, unlike the example shown in FIG. 16 (Example 1). Accordingly, in the examples shown in FIGS. 17 and 18 (Comparative Example 1), it was found that the $2\theta_{004}$ did not satisfy $2\theta_{004} \leq 96.5°$ and thus did not satisfy the above mathematical formula (Mathematical formula 1).

As to Example 1, a film structure body in which the films up to the PZT film as the piezoelectric film 17 had been formed was formed on each of 17 wafers of No. 1 to No. 17 under the same conditions, and the θ-2θ spectrum of the formed film structure body by the XRD method was measured. Namely, for Example 1, 17 film structure bodies were subjected to X-ray diffraction measurement by the θ-2θ method.

Figure 19:
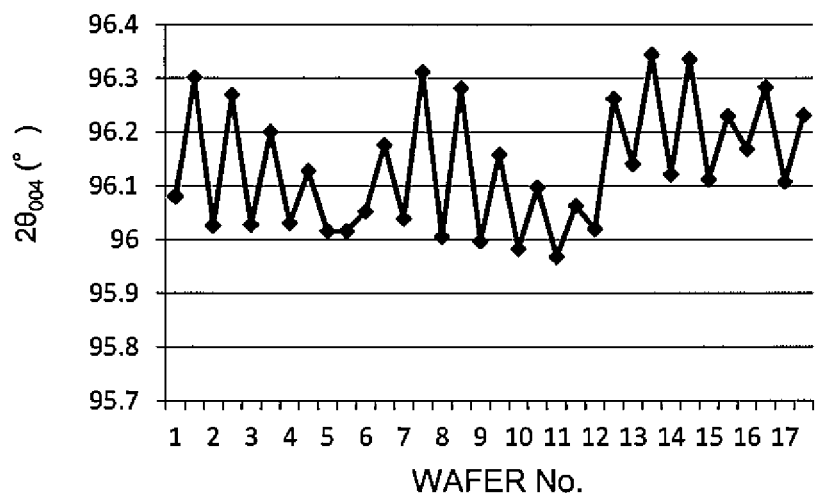
FIG. 19 is a graph showing a diffraction angle $2\theta_{004}$ in an X-ray diffraction pattern of each of film structure bodies formed on each of 17 wafers as Example 1.

FIG. 19 is a graph showing a diffraction angle $2\theta_{004}$ in an X-ray diffraction pattern of each of film structure bodies formed on each of 17 wafers including No. 1 to No. 17 as Example 1. FIG. 19 shows a diffraction angle $2\theta_{004}$ of a film structure body, wherein the diffraction angle $2\theta_{004}$ on the center of the wafer is shown on the left side, and the diffraction angle $2\theta_{004}$ on the outer periphery of the wafer is shown on the right side.

As shown in FIG. 19, in the film structure bodies formed on each of the 17 wafers described as Example 1, all of the diffraction angles $2\theta_{004}$ were greater than 95.9° and smaller than 96.4°. Therefore, in relation to the 17 wafers described as Example 1, it was found that the diffraction angle $2\theta_{004}$ satisfied the above mathematical formula (Mathematical formula 1).

In addition, as to Example 1, a film structure body in which the films up to the PZT film as the piezoelectric film 17 had been formed was formed on each of 12 wafers of No. 21 to No. 32 under the same conditions, and the θ-2θ spectrum of the formed film structure body by the XRD method was measured. Namely, 12 film structure bodies for Example 1 were subjected to X-ray diffraction measurement by the θ-2θ method.

Figure 20:
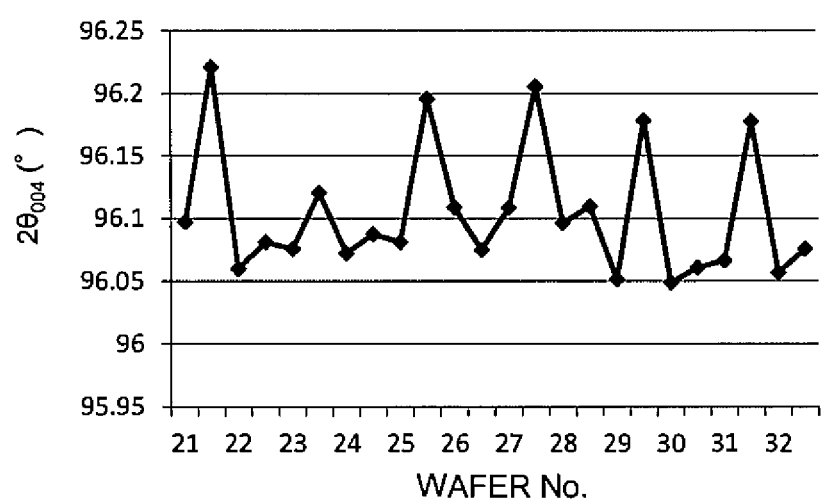
FIG. 20 is a graph showing a diffraction angle $2\theta_{004}$ in an X-ray diffraction pattern of each of film structure bodies formed on each of 12 wafers as Example 1.

FIG. 20 is a graph showing a diffraction angle $2\theta_{004}$ in an X-ray diffraction pattern of each of film structure bodies formed on each of 12 wafers including No. 21 to No. 32 as Example 1. In the same manner as in FIG. 19, FIG. 20 also shows a diffraction angle $2\theta_{004}$ of a film structure body, wherein the diffraction angle $2\theta_{004}$ on the center of the wafer is shown on the left side, and the diffraction angle $2\theta_{004}$ on the outer periphery of the wafer is shown on the right side.

As shown in FIG. 20, in the film structure bodies formed on each of the 12 wafers described as Example 1, all of the diffraction angles $2\theta_{004}$ were greater than 96.0° and smaller than 96.25°. Therefore, in relation to the 12 wafers described as Example 1, it was found that the diffraction angle $2\theta_{004}$ satisfied the above mathematical formula (Mathematical formula 1).

In the θ-2θ spectra in FIGS. 17 and 18, a peak is observed on the high angle side of the (00n) plane (n is a natural number) in the tetragonal representation of PZT. This is because, for example, a (100)-oriented portion of PZT having a tetragonal crystal structure is contained in a trace amount and this portion is considered to function as a stress relaxation layer.

Next, as shown in FIG. 2, a platinum (Pt) film was formed as a conductive film 18 on the piezoelectric film 15 by a sputtering method. Subsequently, voltage dependency of polarization was measured by applying a voltage between the conductive film 13 and the conductive film 18.

Figure 21:
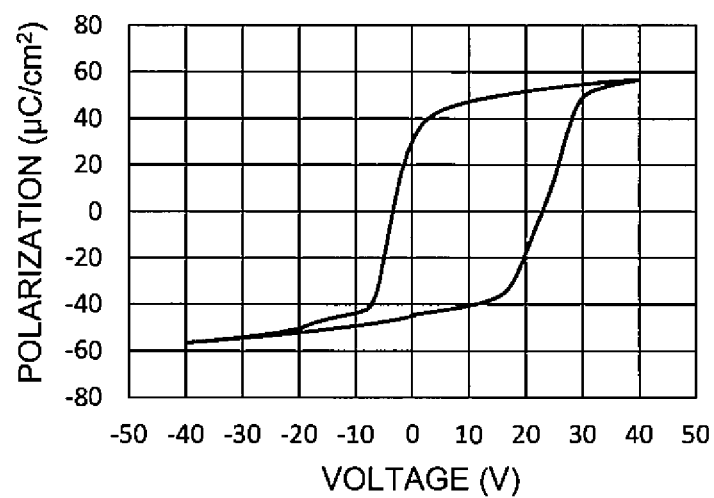
FIG. 21 is a graph showing voltage dependency of polarization of the film structure body in Example 1.
Figure 22:
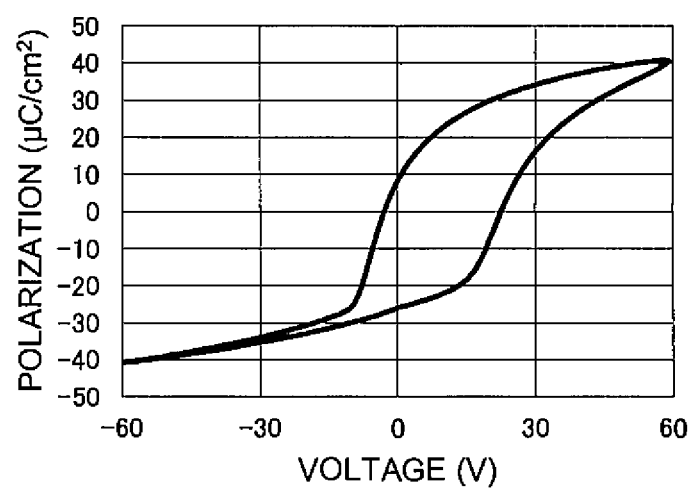
FIG. 22 is a graph showing voltage dependency of polarization of the film structure body in Comparative Example 1.

FIG. 21 is a graph showing voltage dependency of polarization of the film structure body in Example 1. FIG. 22 is a graph showing voltage dependency of polarization of the film structure body in Comparative Example 1. The abscissa of each graph in FIGS. 21 and 22 represents voltage, and the ordinate of each graph in FIGS. 21 and 22 represents polarization (The same also applies to the following graphs showing voltage dependency of polarization).

According to FIG. 21, in the film structure body of Example 1, the relative permittivity $\varepsilon_r$ was 450 or lower (measured value: 450), and the residual polarization value $P_r$ was 28 µC/cm² or higher (measured value: 28 µC/cm²). Furthermore, a cantilever was formed, and as a result of measuring the piezoelectric constant $d_{31}$ through the use of the formed cantilever, the piezoelectric constant $d_{31}$ was 200 pm/V.

On the other hand, according to FIG. 22, the relative permittivity $\varepsilon_r$ exceeded 450 (measured value: 800), and the residual polarization value $P_r$ was lower than 28 µC/cm² (measured value: 10 µC/cm²) in the film structure body of Comparative Example 1. In addition, as a result of measuring the piezoelectric constant $d_{31}$ in the same manner as in Example 1, the piezoelectric constant $d_{31}$ was 140 pm/V. As described above, the method for forming the film structure body of Comparative Example 1 is different from the condition in Example 1 in which the supplied high frequency power is 2250 W, in that the high-frequency power (power) supplied when forming the piezoelectric film 16 through the use of the RF sputtering apparatus is 2750 W.

Therefore, according to Example 1 and Comparative Example 1, it became clear that, when the high-frequency power supplied when forming the piezoelectric film 16 in the film structure body of this embodiment was within a certain range, the relative permittivity $\varepsilon_r$ satisfied the above mathematical formula (Mathematical formula 2), and the residual polarization value $P_r$ satisfied the above mathematical formula (Mathematical formula 3). Accordingly, the condition for forming the film structure bodies of Examples 2 to 9 and Comparative Example 2, and conditions in which the relative permittivity $\varepsilon_r$ satisfies the above mathematical formula (Mathematical formula 2) and the residual polarization value $P_r$ satisfies the above mathematical formula (Mathematical formula 3) will be examined below in detail.

Examples 2 and 3

The film structure body of Example 2 was formed in the same manner as in the method for manufacturing the film structure body of Example 1, except that the substrate temperature in forming the piezoelectric film 16 was changed from 425° C. to 450° C. in the method for manufacturing the film structure body of Example 1. In addition, the film structure body of Example 3 was formed in the same manner as in the method for manufacturing the film structure body of Example 1, except that the substrate temperature in forming the piezoelectric film 16 was changed from 425° C. to 475° C. in the method for manufacturing the film structure body of Example 1.

Figure 23:
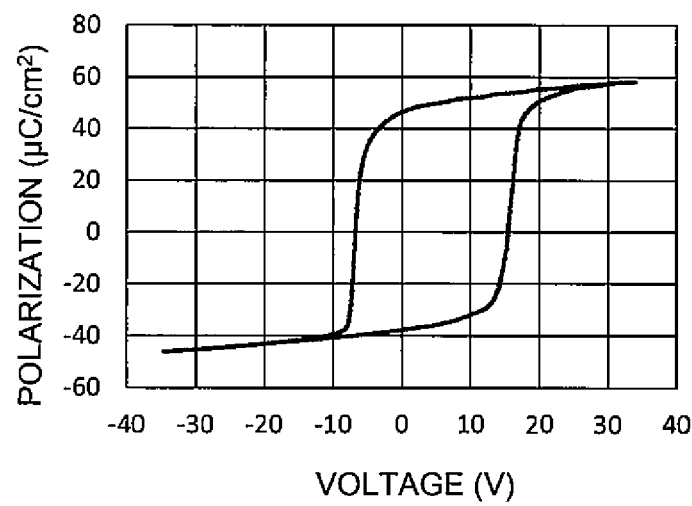
FIG. 23 is a graph showing voltage dependency of polarization of the film structure body in Example 2.
Figure 24:
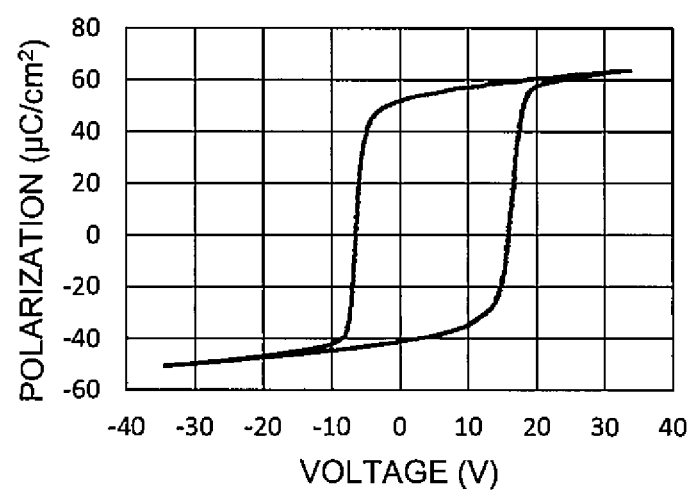
FIG. 24 is a graph showing voltage dependency of polarization of the film structure body in Example 3.

As to the film structure bodies of Examples 2 and 3, voltage dependency of polarization was measured by applying a voltage between the conductive film 13 and the conductive film 18. FIG. 23 is a graph showing voltage dependency of polarization of the film structure body in Example 2. FIG. 24 is a graph showing voltage dependency of polarization of the film structure body in Example 3.

According to FIG. 23, in the film structure body of Example 2, the relative permittivity $\varepsilon_r$ was 450 or lower, and the residual polarization value $P_r$ was 28 µC/cm² or higher (measured value: 41 µC/cm²). Furthermore, according to FIG. 24, in the film structure body of Example 3, the relative permittivity $\varepsilon_r$ was 450 or lower, and the residual polarization value $P_r$ was 28 µC/cm² or higher (measured value: 45 µC/cm²).

Therefore, according to Examples 1 to 3, it became clear that, when the supplied high-frequency power was 2250 W, a relative permittivity $\varepsilon_r$ of 450 or lower and a residual polarization value $P_r$ of 28 µC/cm² or higher were obtained within a range of a substrate temperature of 425 to 475° C. in forming the piezoelectric film 16. Note that detailed explanation is omitted, but when the substrate temperature for forming the piezoelectric film 16 was lower than 425° C. or higher than 475° C., it was difficult to obtain a relative permittivity $\varepsilon_r$ of 450 or lower.

Examples 4 and 5

The film structure body of Example 4 was formed in the same manner as in the method for manufacturing the film structure body of Example 1, except that the high-frequency power supplied in forming the piezoelectric film 16 was changed from 2250 W to 2000 W in the method for manufacturing the film structure body of Example 1. At this time, the film deposition rate was 0.20 nm/s, which was lower than 0.29 nm/s in Example 1.

The film structure body of Example 5 was formed in the same manner as in the method for manufacturing the film structure body of Example 1, except that the high-frequency power supplied in forming the piezoelectric film 16 was changed from 2250 W to 1750 W in the method for manufacturing the film structure body of Example 1. At this time, the film deposition rate was 0.17 nm/s, which was lower than 0.29 nm/s in Example 1.

Figure 25:
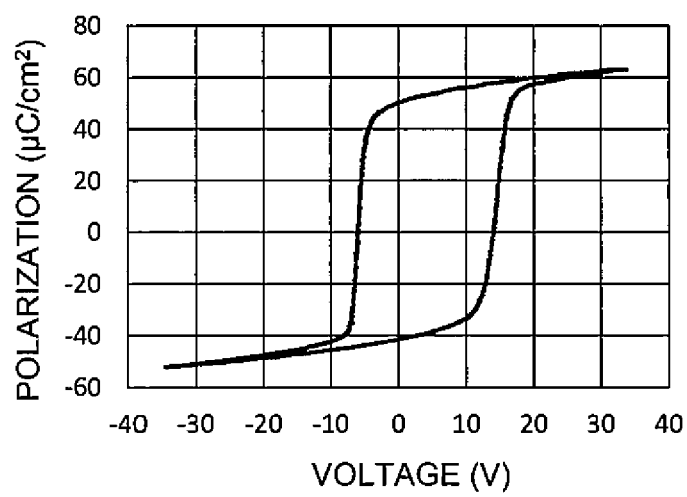
FIG. 25 is a graph showing voltage dependency of polarization of the film structure body in Example 4.
Figure 26:
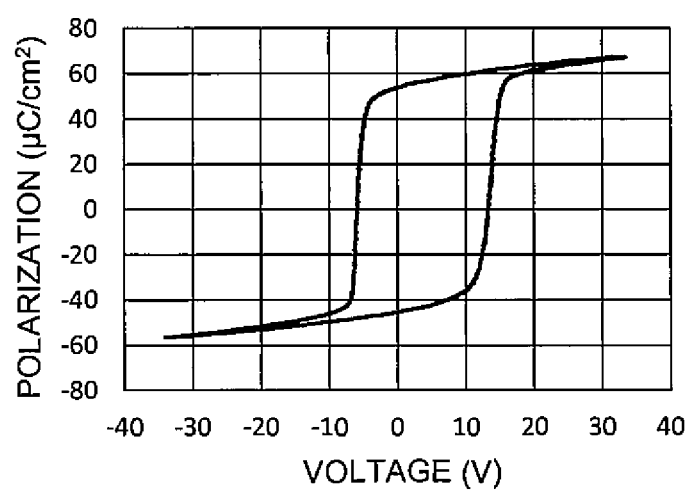
FIG. 26 is a graph showing voltage dependency of polarization of the film structure body in Example 5.

As to the film structure bodies of Examples 4 and 5, voltage dependency of polarization was measured by applying a voltage between the conductive film 13 and the conductive film 18. FIG. 25 is a graph showing voltage dependency of polarization of the film structure body in Example 4. FIG. 26 is a graph showing voltage dependency of polarization of the film structure body in Example 5.

According to FIG. 25, in the film structure body of Example 4, the relative permittivity $\varepsilon_r$ was 450 or lower, and the residual polarization value $P_r$ was 28 $\mu C/cm^2$ or higher (measured value: 45 $\mu C/cm^2$). In addition, according to FIG. 26, in the film structure body of Example 5, the relative permittivity $\varepsilon_r$ was 450 or lower, and the residual polarization value $P_r$ was 28 $\mu C/cm^2$ or higher (measured value: 50 $\mu C/cm^2$).

Therefore, according to Examples 1, 4 and 5, it became clear that, when the substrate temperature was 425° C., a relative permittivity $\varepsilon_r$ of 450 or lower and a residual polarization value $P_r$ of 28 $\mu C/cm^2$ or higher were obtained within a range of a high-frequency power of 1750 to 2250 W supplied in forming the piezoelectric film 16. This is because, when the high-frequency power is within a range of 1750 to 2250 W, the lower the high-frequency power value is, the lower the film deposition rate is, and the crystal of the piezoelectric film 16 slowly grows, whereby single crystallinity of the piezoelectric film 16 was enhanced and the residual polarization value $P_r$ was enhanced.

Examples 6 to 8, and Comparative Example 2

The film structure body of Comparative Example 2 was formed in the same manner as in the method for manufacturing the film structure body of Example 1, except that the value of the high-frequency power supplied in forming the piezoelectric film 16 was changed from 2250 W to 2500 W in the method for manufacturing the film structure body of Example 1. These conditions are shown in FIG. 27. Note that FIG. 27 shows a table, in which the film deposition conditions and the measurement results of the diffraction angle $2\theta_{004}$, the relative permittivity $\varepsilon_r$ and the like of PZT as to Examples 1, 6 to 8, and Comparative Examples 1 and 2 are summarized.

Furthermore, in the method for manufacturing the film structure body of Example 1, the film structure bodies of Examples 6 to 8 were formed in the same manner as in the method for manufacturing the film structure body of Example 1, except that the high-frequency power supplied in forming the piezoelectric film 16 was supplied while the high-frequency power value was being changed in a plurality of divided steps so that the high-frequency power supplied in the subsequent step was smaller than the high-frequency power value supplied in the previous step.

The reason why the high-frequency power is supplied while the value is being changed in a plurality of divided steps in this way is because the mass productivity is lowered when the film deposition rate is initially reduced by decreasing the value of the supplied high-frequency power in the step of forming the piezoelectric film 16. On the other hand, only the overlayer portion of the piezoelectric film 16 is slowly grown, whereby a favorable monocrystalline piezoelectric film 16 is obtained at a relatively high film deposition rate as a whole and thus favorable ferroelectricity can be obtained.

Specifically, in the method for manufacturing the film structure body of Example 6, at the first step of the steps of forming the piezoelectric film 16, the value of the supplied high frequency power was set to 2250 W, the substrate temperature was set to 450° C., the film deposition period was set to 2100 s, and thus $Pb(Zr_{0.58}Ti_{0.42})O_3$ film (underlayer PZT film) having a film thickness of 500 nm was deposited. Next, at the second step of the steps of forming the piezoelectric film 16, the value of the supplied high frequency power was set to 2000 W, the substrate temperature was set to 450° C., the film deposition period was set to 2300 s, and thus $Pb(Zr_{0.58}Ti_{0.42})O_3$ film (overlayer PZT film) having a film thickness of 500 nm was deposited. Accordingly, the piezoelectric film 16 composed of the underlayer PZT film and the overlayer PZT film was formed. These conditions are shown in FIG. 27. Note that FIG. 27 shows only the value (2000 W) in the step of forming the overlayer PZT film as the high frequency power.

In addition, in the method for manufacturing the film structure body of Example 7, at the first step of the steps of forming the piezoelectric film 16, the value of the supplied high frequency power was set to 2250 W, the substrate temperature was set to 450° C., the film deposition period was set to 4200 s, and thus $Pb(Zr_{0.58}Ti_{0.42})O_3$ film (underlayer PZT film) having a film thickness of 1 $\mu m$ was deposited. Next, at the second step of the steps of forming the piezoelectric film 16, the value of the supplied high frequency power was set to 1750 W, the substrate temperature was set to 450° C., the film deposition period was set to 2300 s, and thus $Pb(Zr_{0.58}Ti_{0.42})O_3$ film (mid-layer PZT film) having a film thickness of 500 nm was deposited. Furthermore, at the third step of the steps of forming the piezoelectric film 16, the value of the supplied high frequency power was set to 1750 W, the substrate temperature was set to 425° C., the film deposition period was set to 2300 s, and thus $Pb(Zr_{0.58}Ti_{0.42})O_3$ film (overlayer PZT film) having a film thickness of 500 nm was deposited. Accordingly, the piezoelectric film 16 composed of the underlayer PZT film, the mid-layer PZT film and the overlayer PZT film was formed. The sum of the film deposition periods was 8800 s. These conditions are shown in FIG. 27. Note that FIG. 27 shows only the value (1750 W) in the step of forming the overlayer PZT film as the high frequency power.

In addition, in the method for manufacturing the film structure body of Example 8, at the first step of the steps of forming the piezoelectric film 16, the value of the supplied high frequency power was set to 1750 W, the substrate temperature was set to 450° C., the film deposition period was set to 2300 s, and thus $Pb(Zr_{0.58}Ti_{0.42})O_3$ film (underlayer PZT film) having a film thickness of 500 nm was deposited. Next, at the second step of the steps of forming the piezoelectric film 16, the value of the supplied high frequency power was set to 1750 W, the substrate temperature was set to 425° C., the film deposition period was set to 2100 s, and thus $Pb(Zr_{0.58}Ti_{0.42})O_3$ film (mid-layer PZT film) having a film thickness of 400 nm was deposited. Furthermore, at the third step of the steps of forming the piezoelectric film 16, the value of the supplied high frequency power was set to 1500 W, the substrate temperature was set to 475° C., the film deposition period was set to 900 s, and thus $Pb(Zr_{0.58}Ti_{0.42})O_3$ film (overlayer PZT film)

having a film thickness of 100 nm was deposited. Accordingly, the piezoelectric film 16 composed of the underlayer PZT film, the mid-layer PZT film and the overlayer PZT film was formed. The sum of the film deposition periods was 5300 s. These conditions are shown in FIG. 27. Note that FIG. 27 shows only the value (1500 W) in the step of forming the overlayer PZT film as the high frequency power.

As to each of Examples 6 to 8, the θ-2θ spectrum by an XRD method of the film structure body in which the films up to the PZT film as the piezoelectric film 17 had been formed was measured. Namely, as to each of Examples 6 to 8, X-ray diffraction measurement by the θ-2θ method was carried out.

Figure 28:
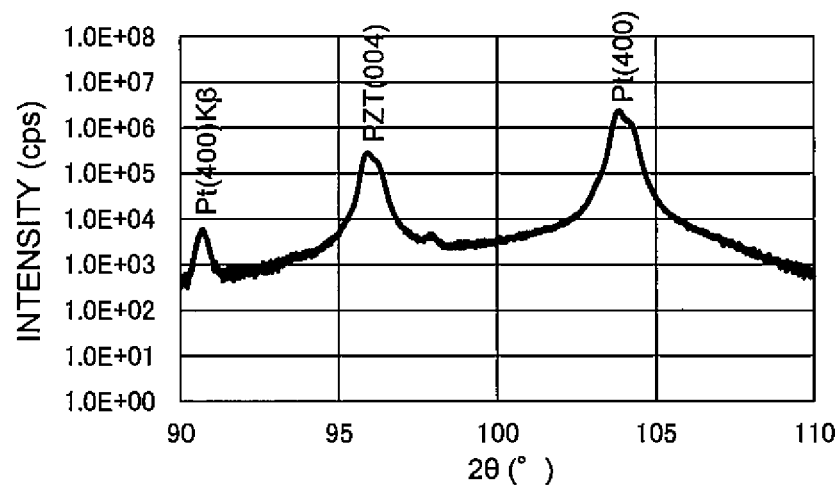
FIG. 28 is a graph showing an example of a θ-2θ spectrum of the film structure body in Example 6 by an XRD method.
Figure 29:
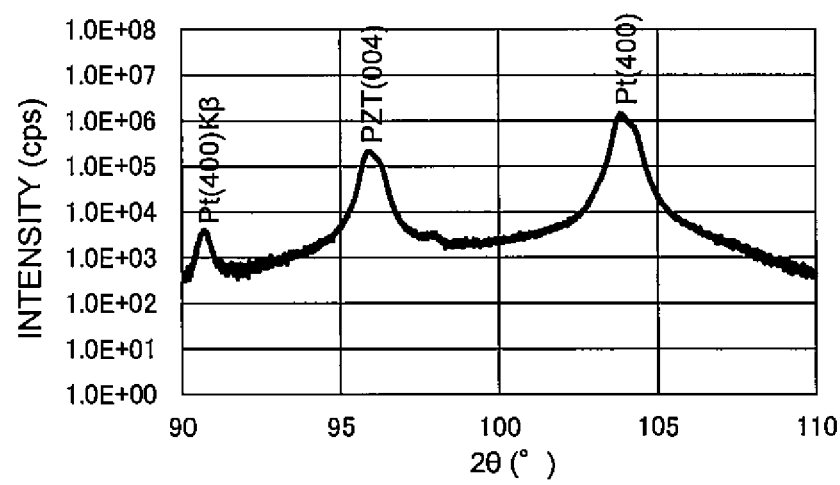
FIG. 29 is a graph showing an example of a θ-2θ spectrum of the film structure body in Example 7 by an XRD method.
Figure 30:
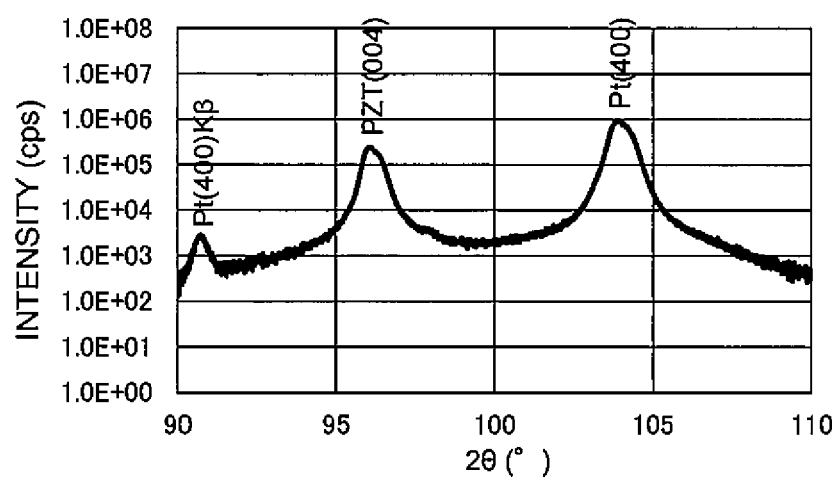
FIG. 30 is a graph showing an example of a θ-2θ spectrum of the film structure body in Example 8 by an XRD method.

Each of FIGS. 28 to 30 is a graph showing an example of the θ-2θ spectrum by an XRD method of the film structure body in which the films up to the PZT film have been formed. The abscissa in each graph of FIGS. 28 to 30 represents an angle 2θ, and the ordinate of each graph of FIGS. 28 to 30 represents an intensity of X-ray. FIG. 28 shows the results for Example 6, FIG. 29 shows the results for Example 7, and FIG. 30 shows the results for Example 8. In addition, FIGS. 28 and 30 show a range of 90°≤2θ≤110°.

Furthermore, $2\theta_{004}$ obtained from FIGS. 16, 18, and 28 to 30 are shown in FIG. 27. Note that the illustration of the θ-2θ spectrum is omitted, but as to the film structure body of Comparative Example 2, $2\theta_{004}$ obtained by measuring the θ-2θ spectrum by the XRD method is shown in FIG. 27.

As shown in FIGS. 28 to 30 and 27, the film structure body of Example 6 showed $2\theta_{004}=96.4°$, the film structure body of Example 7 showed $2\theta_{004}=96.1°$, and the film structure body of Example 8 showed $2\theta_{004}=95.9°$. In addition, as described above, the film structure body of Example 1 showed $2\theta_{004}=96.5°$, and the detailed description is omitted, but the $2\theta_{004}$ of the film structure bodies of Examples 2 to 5 also satisfied $2\theta_{004} \leq 96.5°$. Accordingly, in the film structure bodies of Examples 1 to 8, it was found that the $2\theta_{004}$ satisfied $2\theta_{004} \leq 96.5°$ and thus satisfied the above mathematical formula (Mathematical formula 1).

Figure 31:
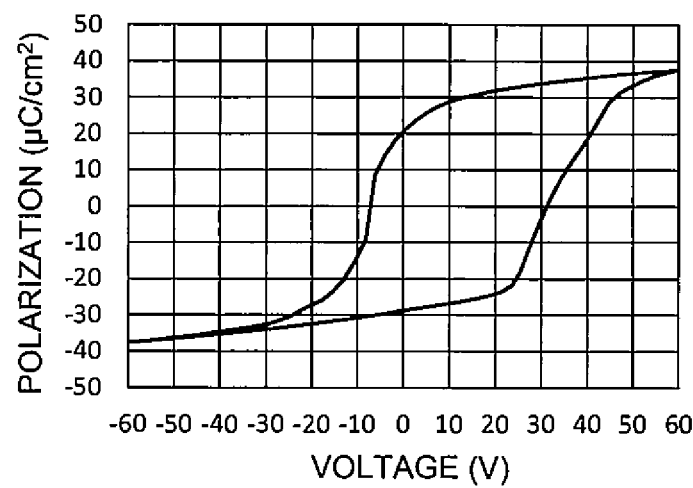
FIG. 31 is a graph showing voltage dependency of polarization of the film structure body in Comparative Example 2.
Figure 32:
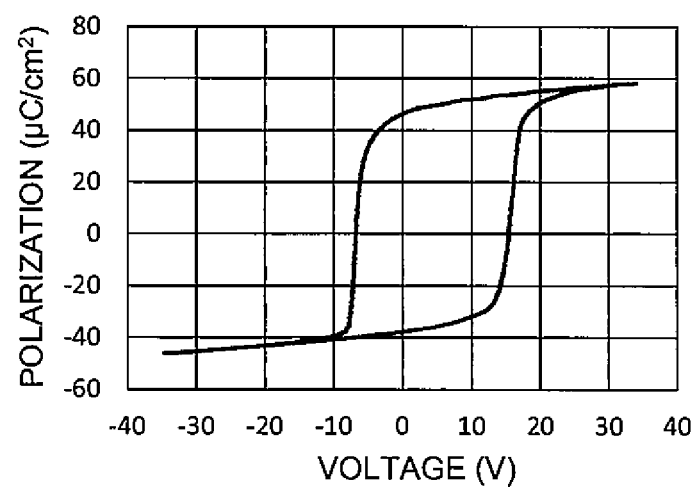
FIG. 32 is a graph showing voltage dependency of polarization of the film structure body in Example 6.
Figure 33:
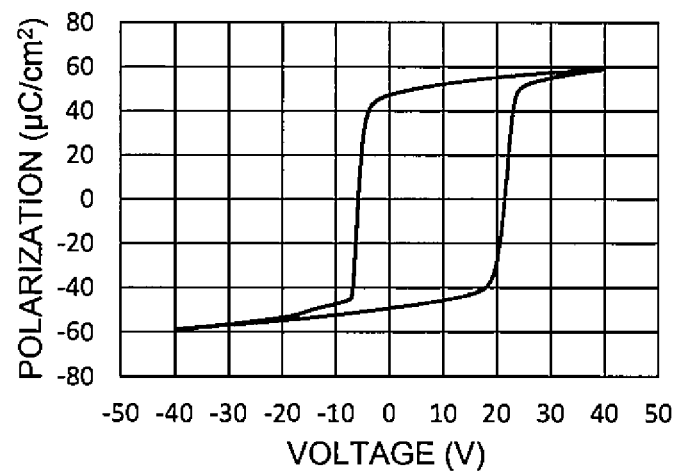
FIG. 33 is a graph showing voltage dependency of polarization of the film structure body in Example 7.
Figure 34:
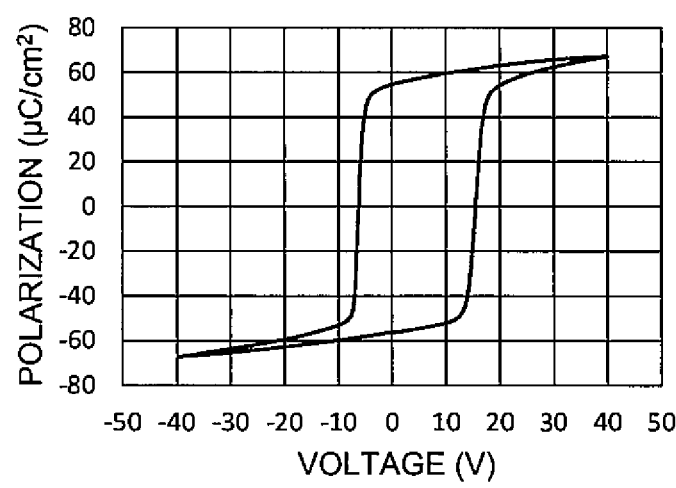
FIG. 34 is a graph showing voltage dependency of polarization of the film structure body in Example 8.

In addition, as to the film structure bodies of Comparative Example 2 and Examples 6 to 8, the voltage dependency of polarization was measured by applying a voltage between the conductive film 13 and the conductive film 18. FIG. 31 is a graph showing voltage dependency of polarization of the film structure body in Comparative Example 2. FIG. 32 is a graph showing voltage dependency of polarization of the film structure body in Example 6. FIG. 33 is a graph showing voltage dependency of polarization of the film structure body in Example 7. FIG. 34 is a graph showing voltage dependency of polarization of the film structure body in Example 8.

According to FIGS. 31 and 27, in the film structure body of Comparative Example 2, the relative permittivity $\varepsilon_r$ was higher than 450 (measured value: 580), and the residual polarization value $P_r$ was lower than 28 μC/cm² (measured value: 18 μC/cm²). In addition, a cantilever was formed, and as a result of measuring the piezoelectric constant $d_{31}$ through the use of the formed cantilever, the piezoelectric constant $d_{31}$ was 178 pm/V.

According to FIGS. 32 and 27, in the film structure body of Example 6, the relative permittivity $\varepsilon_r$ was 450 or lower (measured value: 330), and the residual polarization value $P_r$ was 28 μC/cm² or higher (measured value: 39 μC/cm²). Furthermore, as a result of measuring the piezoelectric constant $d_{31}$ in the same manner as in Comparative Example 2, the piezoelectric constant $d_{31}$ was 210 pm/V.

Moreover, according to FIGS. 33 and 27, in the film structure body of Example 7, the relative permittivity $\varepsilon_r$ was 450 or lower (measured value: 263), and the residual polarization value $P_r$ was 28 μC/cm² or higher (measured value: 48 μC/cm²). In addition, as a result of measuring the piezoelectric constant $d_{31}$ in the same manner as in Comparative Example 2, the piezoelectric constant $d_{31}$ was 220 pm/V.

In addition, according to FIGS. 34 and 27, in the film structure body of Example 8, the relative permittivity $\varepsilon_r$ was 450 or lower (measured value: 216), and the residual polarization value $P_r$ was 28 μC/cm² or higher (measured value: 57 μC/cm²). Furthermore, as a result of measuring the piezoelectric constant $d_{31}$ in the same manner as in Comparative Example 2, the piezoelectric constant $d_{31}$ was 230 pm/V.

Therefore, according to Examples 1 to 8, it was found that the relative permittivity $\varepsilon_r$ satisfied $\varepsilon_r \leq 450$, the residual polarization value $P_r$ satisfied $P_r \geq 28$ μC/cm², the piezoelectric constant $d_{31}$ satisfied $d_{31} \geq 200$ pm/V, and thus the above mathematical formulas (Mathematical formula 1) and (Mathematical formula 2) were satisfied.

As described above, it is considered that, also in PZT, the relative permittivity decreases as a consequence of enhancement of crystallinity including orientation of a thin film, as with PbTiO₃. Namely, in Example 1 to Example 8, a fact that relative permittivity $\varepsilon_r$ decreases to 450 or less shows that the piezoelectric film 15 has been put into a single crystal state.

Piezoelectric phenomenon means a phenomenon in which, when a stress is applied to a piezoelectric body, a crystal lattice of the piezoelectric body is strained and thus electric charge corresponding to the strain is generated on the piezoelectric body. Thus, the piezoelectric strain is a value obtained by dividing the charge density generated on the piezoelectric body by the stress applied to the piezoelectric body, and when the piezoelectric body is a ferroelectric substance, the piezoelectric strain is proportional to the residual polarization value.

In addition, a capacitance of a capacitor composed of a dielectric substance and two electrodes formed above and below the dielectric substance is proportional to the relative permittivity of the dielectric substance and the each area of the two electrodes, but is inversely proportional to the thickness of the dielectric substance i.e. the distance between the two electrodes. Because of this fact and the charge generation during the stress application to the piezoelectric body, piezoelectric strain is proportional to the relative permittivity of the dielectric substance composed of the piezoelectric body.

In Comparative Examples 1 and 2, and Examples 1, and 6 to 8, as a result of obtaining a product $(P_r \cdot \varepsilon_r)$ of the residual polarization value $P_r$ and the relative permittivity $\varepsilon_r$, there is favorable proportional relation between the value $P_r \cdot \varepsilon_r$ and the piezoelectric constant $d_{31}$ as shown in FIG. 27. Therefore, as described above, it was confirmed that the piezoelectric strain was proportional to the residual polarization value and proportional to the relative permittivity.

Note that the fracture surface was observed by SEM. As a result, although the detailed explanation is omitted, the piezoelectric film 16 had favorable single crystallinity in Examples 1, and 6 to 8, whereas a crack (fissure) extending in the thickness direction of the piezoelectric film 16 was observed between the two crystal grains adjacent in a direction along the principal surface on the piezoelectric film 16 in Comparative Examples 1 and 2, whereby it was found that single crystallinity of the piezoelectric film 15 decreased. In FIG. 27, the case where a crack is observed is represented by "cross", and the case where no crack is observed is represented by "circle".

From the above results, it became clear that the piezoelectric film of the film structure body satisfied the above mathematical formulas (Mathematical formula 1) and (Mathematical formula 2), whereby a piezoelectric film made of a high-quality single crystal film was able to be obtained, the relative permittivity of the piezoelectric film was able to be reduced and the piezoelectric property of the piezoelectric film was able to be enhanced, and thus the piezoelectric property of the piezoelectric film was enhanced, and detection sensitivity of a pressure sensor using the piezoelectric film was enhanced.

Examples 9 and 10

Figure 35:
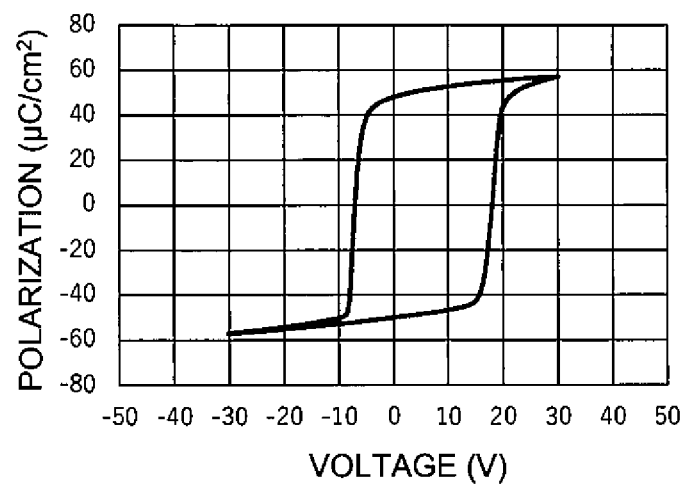
FIG. 35 is a graph showing voltage dependency of polarization of the film structure body in Example 9.
Figure 36:
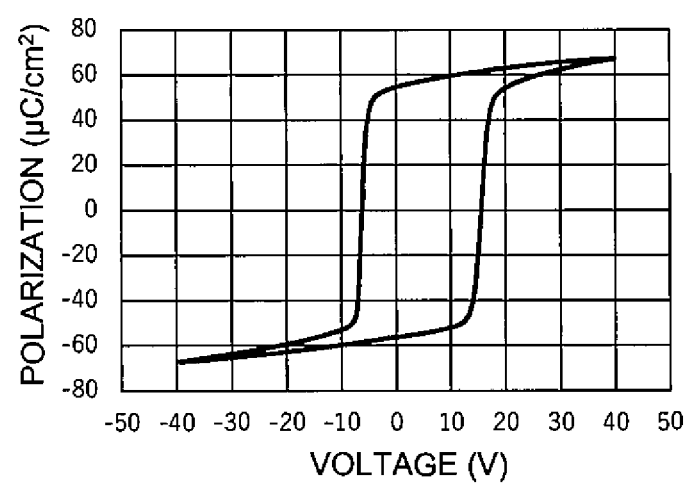
FIG. 36 is a graph showing voltage dependency of polarization of the film structure body in Example 10.

The film structure body of Example 9 was formed in the same manner as in the method for manufacturing the film structure body of Example 1. In addition, the film structure body of Example 10 was formed in the same manner as in the method for manufacturing the film structure body of Example 1 except that the composition of PZT was changed from x=0.42 to x=0.48 in the method for manufacturing the film structure body of Example 1. As to the film structure bodies of Examples 9 and 10, voltage dependency of polarization was measured by applying a voltage between the conductive film 13 and the conductive film 18. FIG. 35 is a graph showing voltage dependency of polarization of the film structure body in Example 9. FIG. 36 is a graph showing voltage dependency of polarization of the film structure body in Example 10.

Furthermore, the results of measuring ferroelectric properties, piezoelectric properties and the like as to Examples 9 and 10 are shown in Table 2. Table 2 shows residual polarization value $P_r$, relative permittivity $\varepsilon_r$, dielectric loss tangent tan δ, piezoelectric constant $d_{31}$, piezoelectric constant $g_{31}$, piezoelectric constant $e_{31}$ and film thickness. Note that in Table 2, the piezoelectric constant $d_{31}$, the piezoelectric constant $g_{31}$ and the piezoelectric constant $e_{31}$ are expressed not as absolute values, but with signs.

TABLE 2

|  | EXAMPLE 9 | EXAMPLE 10 |
|---|---|---|
| RESIDUAL POLARIZATION VALUE $P_r$ (μC/cm²) | 50 | 60 |
| RELATIVE PERMITTIVITY $\varepsilon_r$ (—) | 200 | 300 |
| DIELECTRIC LOSS TANGENT tan δ (%) | 0.01 | 0.01 |
| PIEZOELECTRIC CONSTANT $d_{31}$ (pm/V) | −200 | −250 |
| PIEZOELECTRIC CONSTANT $g_{31}$ (Vm/N) | −100 × 10³ | −80 × 10³ |
| PIEZOELECTRIC CONSTANT $e_{31}$ (C/m²) | −25 | −27 |
| FILM THICKNESS (μm) | 0.5~20 | 0.5~20 |

As shown in FIG. 35 and Table 2, in a case of x=0.42 (Example 9), the residual polarization value $P_r$ was 50 μC/cm², the relative permittivity $\varepsilon_r$ was 200, the tan δ was 0.01%, the piezoelectric constant $d_{31}$ was −200 pm/V, the piezoelectric constant $g_{31}$ was −100×10³ Vm/N, the piezoelectric constant $e_{31}$ was −25 C/m², and favorable characteristics were obtained. Furthermore, as shown in FIG. 36 and Table 2, also in the case of x=0.48, the residual polarization value $P_r$ was 60 μC/cm², the relative permittivity $\varepsilon_r$ was 300, the tan δ was 0.01%, the piezoelectric constant $d_{31}$ was −250 pm/V, the piezoelectric constant $g_{31}$ was −80×10³ Vm/N, the piezoelectric constant $e_{31}$ was −27 C/m², and favorable characteristics were obtained. Moreover, although detailed explanation is omitted, also in a case where the value of x was changed in a range of 0.32≤x≤0.52, favorable characteristics were obtained. From the above results, it became clear that favorable characteristics are obtained in the range of 0.32≤x≤0.52 including the cases of x=0.42 and 0.48.

As described above, the invention made by the present inventors has been specifically explained on the basis of its embodiments, but the present invention is not limited to the above-described embodiments, and it is needless to say that various changes can be made without departing from the gist of the invention.

Within the scope of the spirit of the present invention, those skilled in the art can conceive various changes and modifications, and it is understood that the changes and modifications belong to the scope of the present invention.

For example, the above-described respective embodiments for which addition and deletion of the constituents or change of the design, or addition and omission of the steps or change of the condition have been appropriately carried out by those skilled in the art are also included in the scope of the present invention as long as they have the gist of the present invention.

EXPLANATION OF SYMBOLS

10: film structure body
11: substrate
11a: upper surface
12: orientation film
13, 18: conductive film
14, 17f: film
15, 16, 17: piezoelectric film
16g, 17g: crystal grains
20: film deposition apparatus
21: chamber
21a: bottom plate part
21b, 21e: side plate part
21c, 21f: top plate part
21d: lid part
22: vacuum evacuation part
23, 24: gas supply part
23a, 24a: flow rate controller
23b, 24b: gas supply tube
25: substrate-holding part
25a: insulating enclosure part
25b: protrusion part
25c: conductive enclosure part
25d: step part
26: support part
27: rotation drive part
27a: motor
27b: belt
27c: pulley
27d: rotation shaft
28: substrate-heating part
29: deposition-preventive plate
31: target-holding part
32: power supply part
32a: high-frequency power source
32b: matching device
33: $V_{DC}$ controller
34: magnet part 35: magnet rotation drive part
41, 42, 45, 46, 47: conductive member
41a, 42a, 45a: base part
41b, 42b, 45b: shaft part
41c, 42b, 45c: connection part
43, 56: screw
44: slip ring
51, 52, 53, 54, 55: insulating member
BP1: backing plate
CE1: sealing part
CN1: center
CP1: ferroelectric capacitor
EP: end point
OP1, OP2, OP3: opening
P1: polarization component
RA1: rotation axis
SB: substrate
SP: starting point
TG: target
TM1: target material

The invention claimed is:

1. A film structure body, comprising:
a silicon substrate including a principal surface composed of a (100) plane;
a zirconium oxide film that is on the principal surface of the silicon substrate, has a cubic crystal structure, and is (100)-oriented; and
a conductive film that is on the zirconium oxide film, and includes a platinum film having a cubic crystal structure and being (100)-oriented,
wherein a <100> direction of the platinum film is along a <110> direction of the silicon substrate in the principal surface of the silicon substrate.

2. The film structure body according to claim 1, further comprising:
a piezoelectric film that is on the conductive film, and includes a lead zirconate titanate film having a tetragonal crystal structure and being (001)-oriented.

3. The film structure body according to claim 2, wherein, in an X-ray diffraction pattern of the piezoelectric film, by a θ-2θ method using a CuKα ray:
a diffraction angle of a diffraction peak of a (004) plane of lead zirconate titanate is $2\theta_{004}$;
relative permittivity of the piezoelectric film is $\varepsilon_r$;
$2\theta_{004} \leq 96.5°$; and
$\varepsilon_r \leq 450$.

4. The film structure body according to claim 3, wherein:
a residual polarization value of the piezoelectric film is $P_r$; and
$P_r \geq 28$ μC/cm².

5. The film structure body according to claim 3, wherein:
the conductive film is a first conductive film;
the film structure body further comprises a second conductive film on the piezoelectric film; and
the relative permittivity of the piezoelectric film is measured by applying an alternating voltage having a frequency of 1 kHz between the first conductive film and the second conductive film.

6. The film structure body according to claim 2, wherein:
the zirconium oxide film is a first film;
the film structure body further comprises a second film that is on the conductive film and contains a composite oxide represented by $Sr(Ti_{1-z}Ru_z)O_3$ and (100)-oriented in a pseudo-cubic representation;
the second film is in between the piezoelectric film and the conductive film; and
$0 \leq z \leq 1$.

7. A film structure body, comprising:
a silicon substrate including a principal surface composed of a (100) plane;
a zirconium oxide film that is on the principal surface of the silicon substrate, has a cubic crystal structure, and is (100)-oriented;
a conductive film that is on the zirconium oxide film and contains platinum having a cubic crystal structure and being (100)-oriented; and
a piezoelectric film that is on the conductive film and contains lead zirconate titanate having a tetragonal crystal structure and being (001)-oriented,
wherein:
a <100> direction of the platinum is along a <110> direction of the silicon substrate in the principal surface of the silicon substrate;
in an X-ray diffraction pattern of the piezoelectric film by a θ-2θ method using a CuKα ray:
a diffraction angle of a diffraction peak of a (004) plane of lead zirconate titanate is $2\theta_{004}$; and
relative permittivity of the piezoelectric film is $\varepsilon_r$;
$2\theta_{004} \leq 96.5°$; and
$\varepsilon_r \leq 450$.

8. The film structure body according to claim 7, wherein:
a residual polarization value of the piezoelectric film is $P_r$; and
$P_r \geq 28$ μC/cm².

9. The film structure body according to claim 7, wherein:
the conductive film is a first conductive film;
the film structure body further comprises a second conductive film on the piezoelectric film; and
the relative permittivity of the piezoelectric film is measured by applying an alternating voltage having a frequency of 1 kHz between the first conductive film and the second conductive film.

10. The film structure body according to claim 7, wherein:
the zirconium oxide film is a first film;
the film structure body further comprises a second film that is on the conductive film and contains a composite oxide represented by $Sr(Ti_{1-z}Ru_z)O_3$ and (100)-oriented in a pseudo-cubic representation;
the second film is in between the piezoelectric film and the conductive film; and
$0 \leq z \leq 1$.

11. The film structure body according to claim 7, wherein:
the zirconium oxide film is epitaxially grown on the principal surface of the silicon substrate;
the conductive film is epitaxially grown on the zirconium oxide film; and
the piezoelectric film is epitaxially grown on the conductive film.

* * * * *